United States Patent
Koivisto et al.

(10) Patent No.: US 10,978,255 B2
(45) Date of Patent: Apr. 13, 2021

(54) BICHROMIC BIPODAL TRIPHENYLAMINE-BASED DYES WITH HIGH PHOTO-ELECTRON CONVERSION AT LOW LIGHT INTENSITIES

(71) Applicants: Bryan Koivisto, Toronto (CA); Benjamin J. D. Fischer, Toronto (CA); Omar K. Abdi, Toronto (CA); Olga Sarycheva, Brampton (CA); Burhan A. Hussein, Toronto (CA); Selvyn Simoes, Toronto (CA); Francis Buguis, Toronto (CA); Hardeep S. Devgan, Toronto (CA)

(72) Inventors: Bryan Koivisto, Toronto (CA); Benjamin J. D. Fischer, Toronto (CA); Omar K. Abdi, Toronto (CA); Olga Sarycheva, Brampton (CA); Burhan A. Hussein, Toronto (CA); Selvyn Simoes, Toronto (CA); Francis Buguis, Toronto (CA); Hardeep S. Devgan, Toronto (CA)

( * ) Notice: Subject to any disclaimer, the term of this patent is extended or adjusted under 35 U.S.C. 154(b) by 0 days.

(21) Appl. No.: 16/495,322

(22) PCT Filed: Oct. 30, 2018

(86) PCT No.: PCT/CA2018/051381
§ 371 (c)(1),
(2) Date: Sep. 18, 2019

(87) PCT Pub. No.: WO2019/084685
PCT Pub. Date: May 9, 2019

(65) Prior Publication Data
US 2020/0027666 A1    Jan. 23, 2020

Related U.S. Application Data

(60) Provisional application No. 62/580,653, filed on Nov. 2, 2017.

(51) Int. Cl.
*C09B 57/08*    (2006.01)
*H01G 9/20*    (2006.01)
(Continued)

(52) U.S. Cl.
CPC ......... *H01G 9/2059* (2013.01); *C09B 57/008* (2013.01); *H01L 51/0059* (2013.01);
(Continued)

(58) Field of Classification Search
CPC .............. H01G 9/2059; H01L 51/0059; H01L 51/0061; H01L 51/0068; H01L 51/4226; C09B 57/008
See application file for complete search history.

(56) References Cited

U.S. PATENT DOCUMENTS

2008/0067476 A1*  3/2008  Shigaki ............... H01L 51/0059
                                                                    252/501.1

FOREIGN PATENT DOCUMENTS

JP          2009093909 A       4/2009

OTHER PUBLICATIONS

Hogberg, Daniel P., et al. "Tuning the HOMO and LUMO energy levels of organic chromophores for dye sensitized solar cells." The Journal of organic chemistry 72, No. 25 (2007): 9550-9556.
(Continued)

*Primary Examiner* — Timothy R Rozof
(74) *Attorney, Agent, or Firm* — Caesar Rivise, PC

(57) ABSTRACT

A bichromic bipodal triphenyl amine based dye of the following formula:

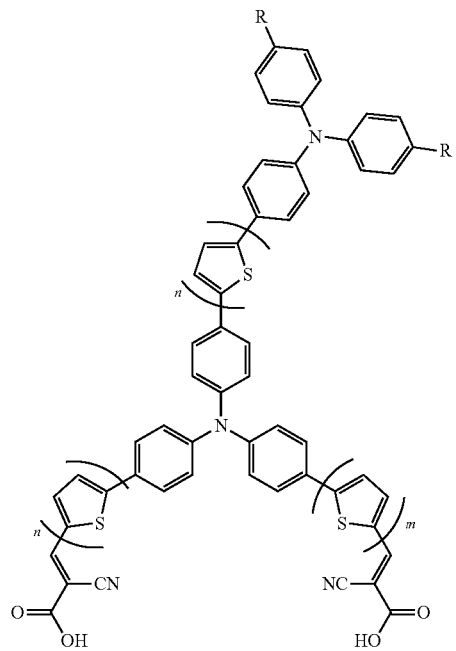

Genaric Bichromic Bipedal Dye Structure

| n | 0 | 1 | 0 | 2 | 2 | 2 | 0 | 1 | 3 | 3 | 3 | 3 | 0 | 1 | 2 |
| m | 0 | 0 | 1 | 0 | 1 | 2 | 2 | 2 | 0 | 1 | 2 | 3 | 3 | 3 | 3 |

(Continued)

-continued

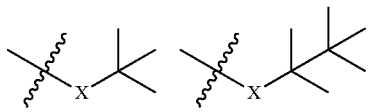

-continued

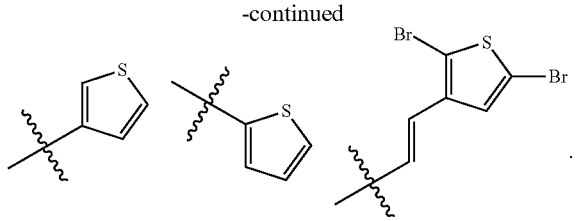

26 Claims, 3 Drawing Sheets

(51) Int. Cl.
C09B 57/00 (2006.01)
H01L 51/00 (2006.01)
H01L 51/42 (2006.01)

(52) U.S. Cl.
CPC ....... H01L 51/0061 (2013.01); *H01G 9/2031* (2013.01); *H01L 51/0068* (2013.01); *H01L 51/4226* (2013.01)

(56) References Cited

OTHER PUBLICATIONS

International Search Report for PCT/CA2018/051381 dated Jan. 17, 2019.
Seo, Kang Deuk, et al. "Dual-channel anchorable organic dye with triphenylamine-based core bridge unit for dye-sensitized solar cells." Dyes and Pigments 99.3 (2013): 599-606.
Yang, Chien-Hsin, et al. "Characteristics of triphenylamine-based dyes with multiple acceptors in application of dye-sensitized solar cells." Journal of Power Sources 188.2 (2009): 627-634.

* cited by examiner

X = O, S, C, N   y < 10

Wherein R=

BICHROMIC BIPODAL TRIPHENYLAMINE-BASED DYES WITH HIGH PHOTO-ELECTRON CONVERSION AT LOW LIGHT INTENSITIES

FIELD OF THE DISCLOSURE

This disclosure relates to the conversion of solar energy to electric current via a dye-sensitized solar cell (DSSC) with bichromic bipodal triphenylamine-based dyes, their manufacture and method of use.

BACKGROUND

Dyes for a DSSC have often been ruthenium-based (for example N-719) due to their good power conversion efficiencies. More recently, porphyrin dyes have gained popularity having exceeded 12% power conversion efficiency and organic dyes have gained notoriety due to their tunable properties.

Performance of the DSSC is limited because of dye performance and existing dyes have poor panchromatic absorption, poor redox stability, short lifetime and poor electronic communication between interfaces.

Some triphenylamine dye architectures have been investigated to address the problems mentioned above. These dyes have multiple triphenylamine donor units instead of just one appended to the ends of a central triphenylamine and a single cyanoacetic acid group present opposite to the triphenylamines. A drawback of these architectures is that single redox active donors are employed and donor units are modified with alkyl chains that increase the hydrodynamic volume which ultimately limits efficiencies and reduces dye loading in a DSSC. Furthermore, this architecture has only one binding group present limiting adhesion and communication with the interface.

There is a need for a dye for use in DSSCs with 1) increased panchromatic absorption into the near-IR; 2) improved redox stability and dye lifetime; and 3) improved electronic communication between interfaces.

SUMMARY

According to one aspect, there is provided a bichromic bipodal triphenyl amine based dye of the following formula:

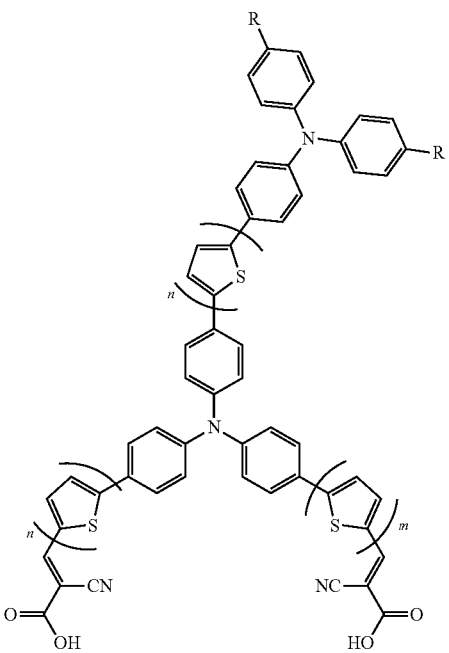

Generic Bichromic Bipedal Dye Structure

| n | 0 | 1 | 0 | 2 | 2 | 2 | 0 | 1 | 3 | 3 | 3 | 3 | 0 | 1 | 2 |
| m | 0 | 0 | 1 | 0 | 1 | 2 | 2 | 2 | 0 | 1 | 2 | 3 | 3 | 3 | 3 |

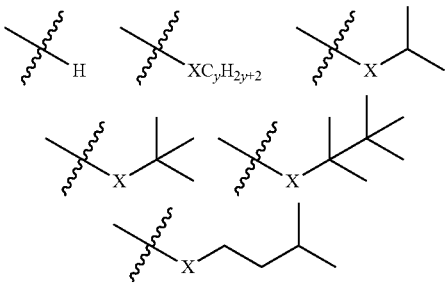

$X = O, S, C, N \quad y < 10$

Wherein R=

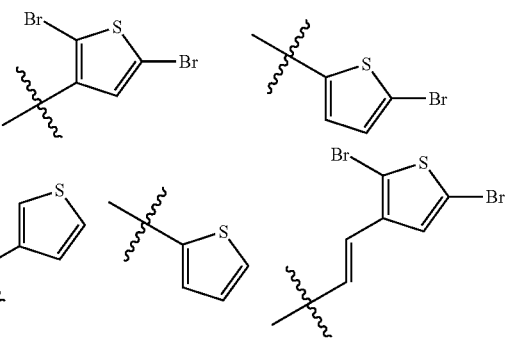

According to one aspect, there is provided a process to synthesize bichromic bipodal triphenylamine based dyes described above, said process comprising: said process comprising:

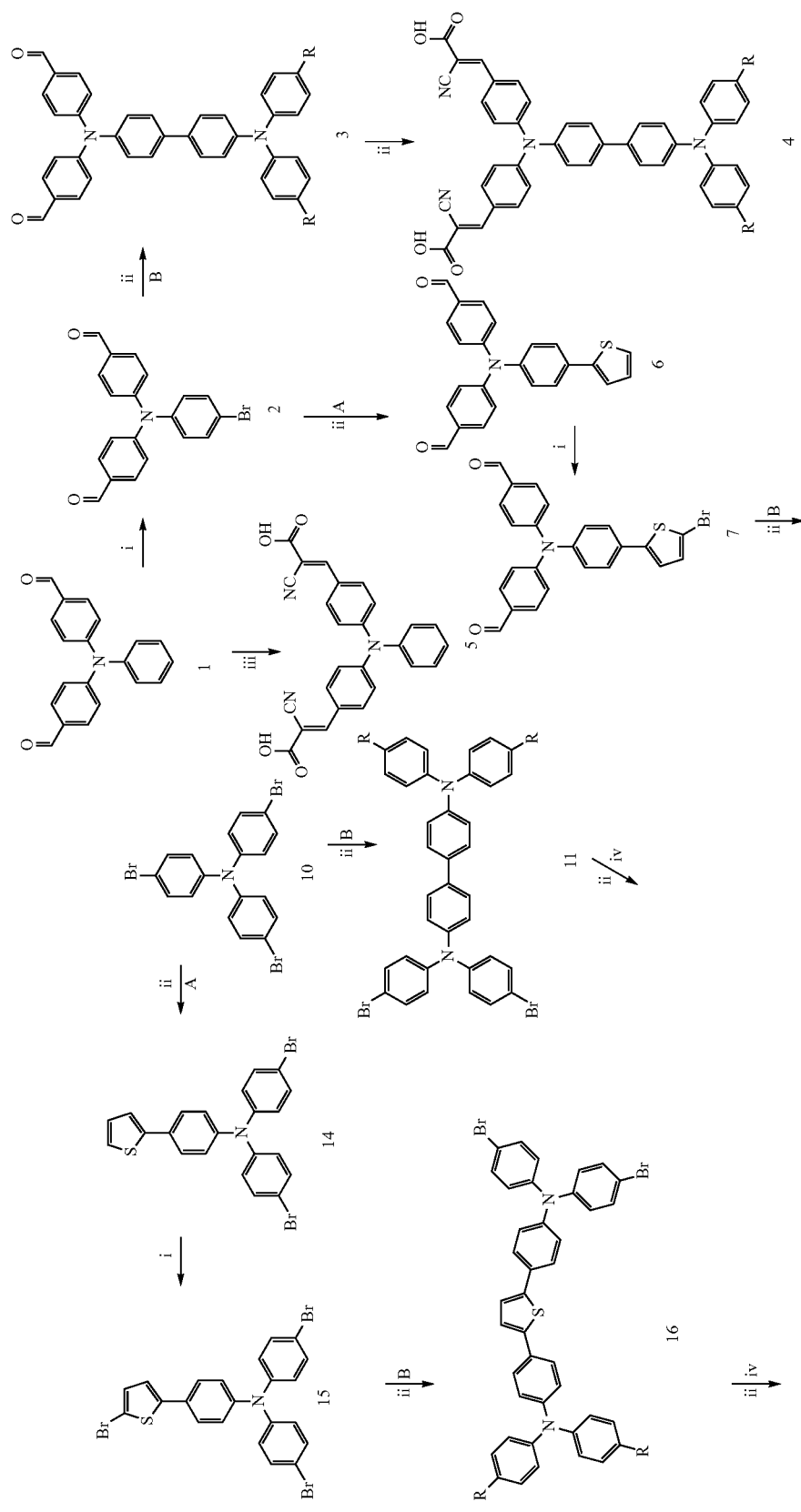

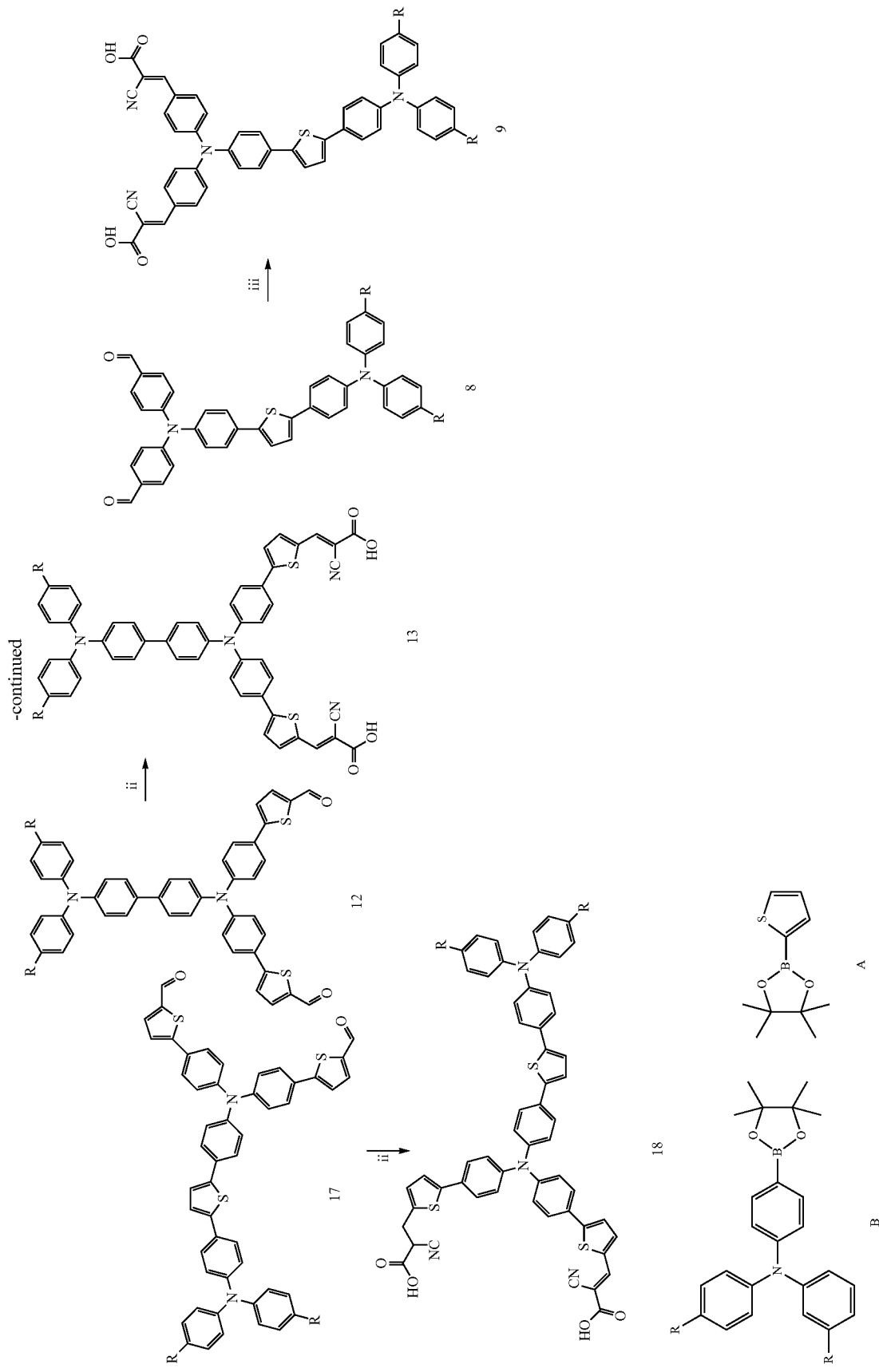

Wherein R is defined above.
According to another aspect, there is provided an alternative process to synthesize bichromic bipodal triphenylamine based dyes said alternative process comprising:
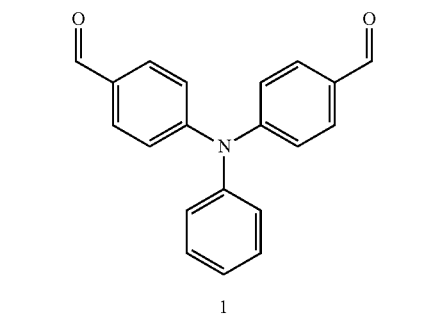
1
i↓
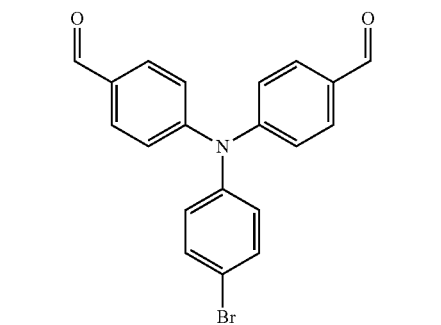
2
v↓
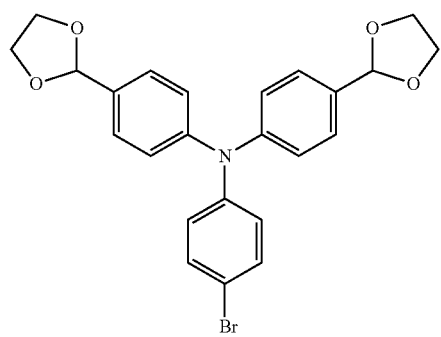
19
vi↓
-continued
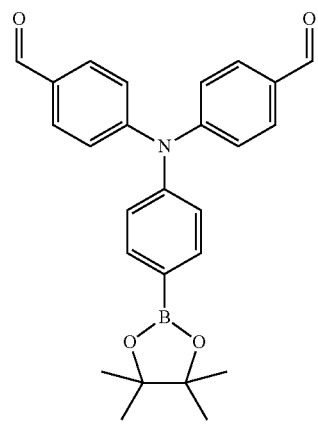
20
ii↓C
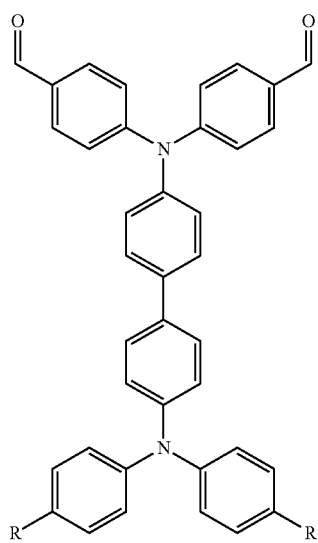
3
iii↓

11
-continued
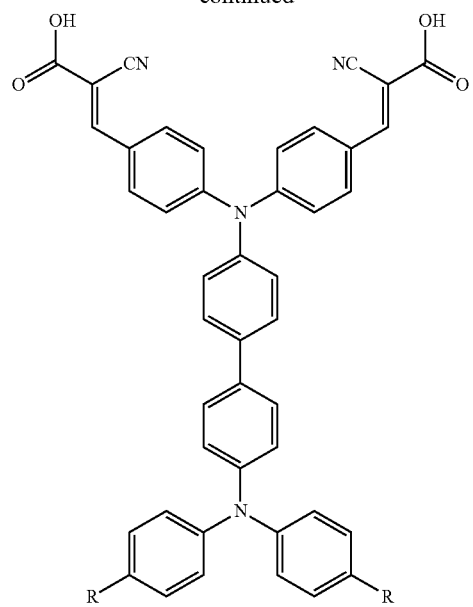
4
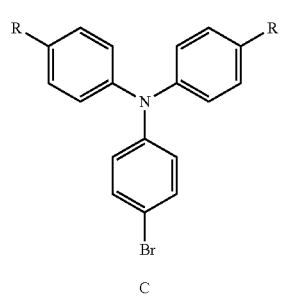
C
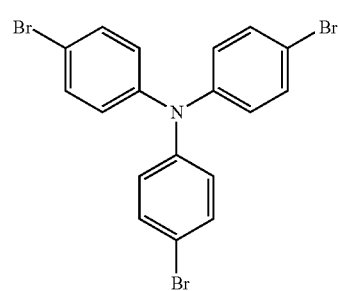
10
vi ↓
12
-continued
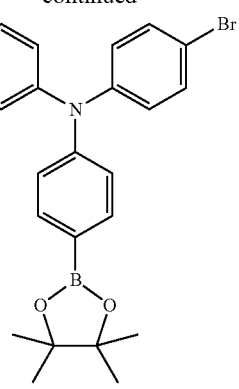
21
ii ↓ c
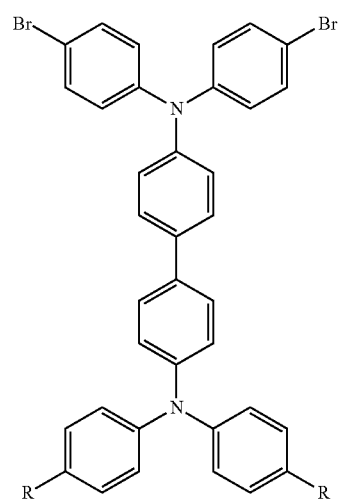
11
ii ↓ iv 13
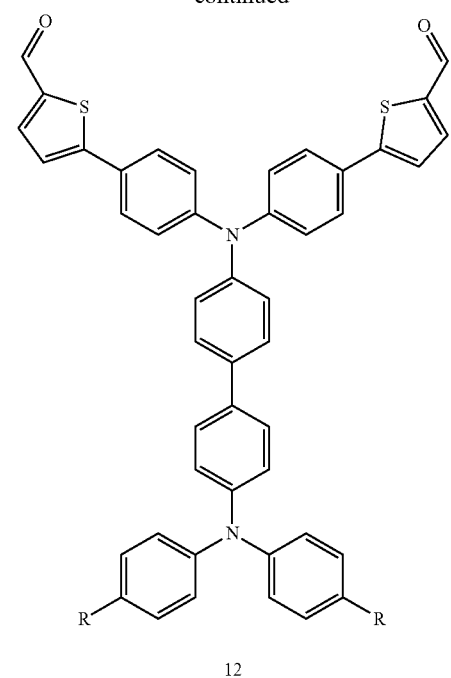
12
iii ↓
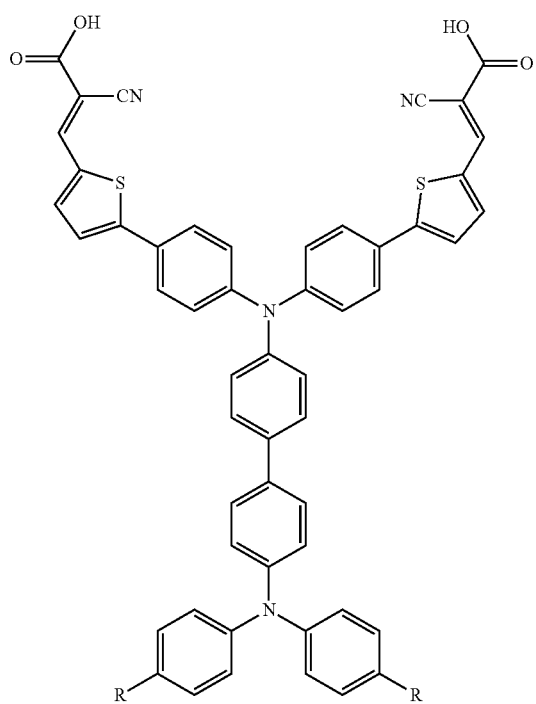
13
14
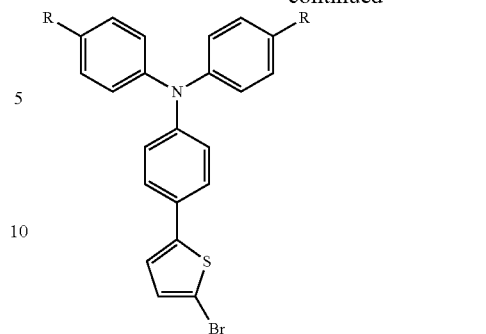
D
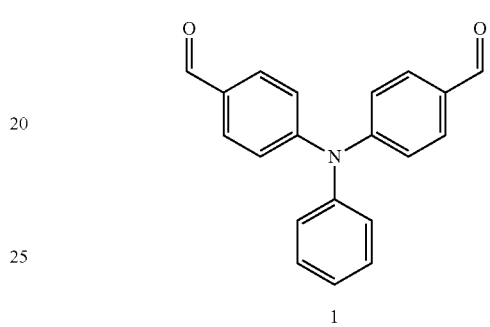
1
i ↓
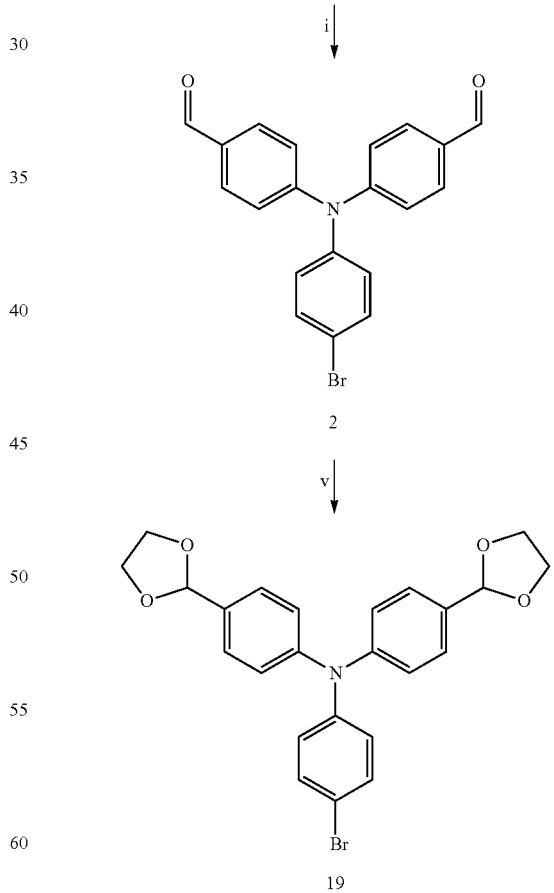
2
v ↓
19
vi ↓

15
-continued
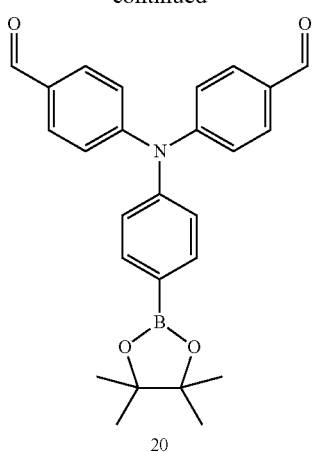
ii ↓ D
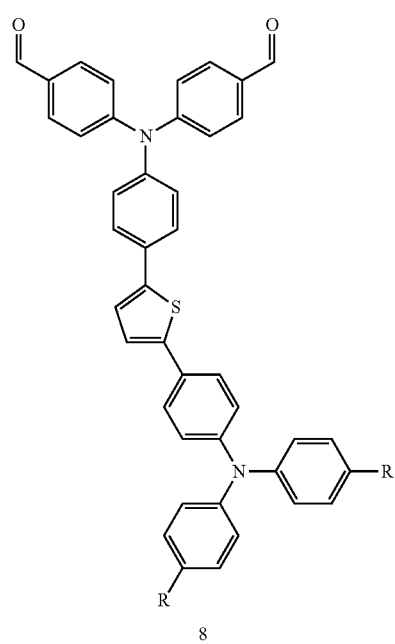
8
iii ↓
16
-continued
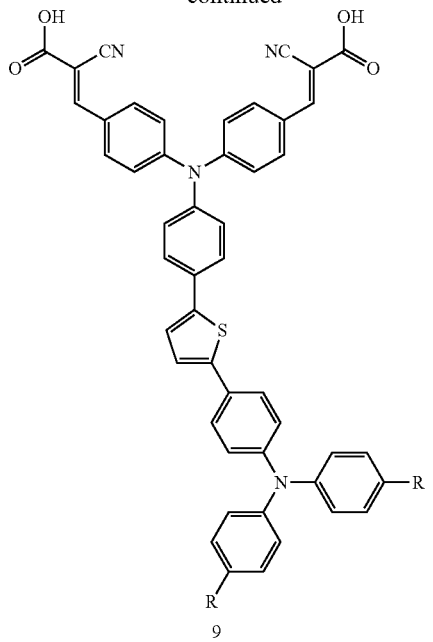
9
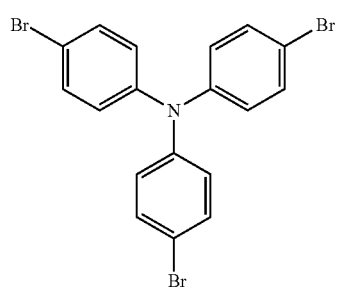
10
vi ↓
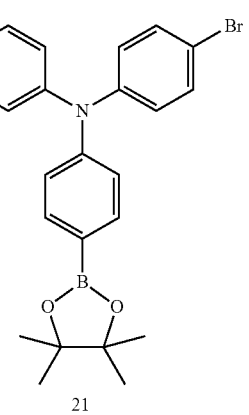
21
ii ↓ D -continued

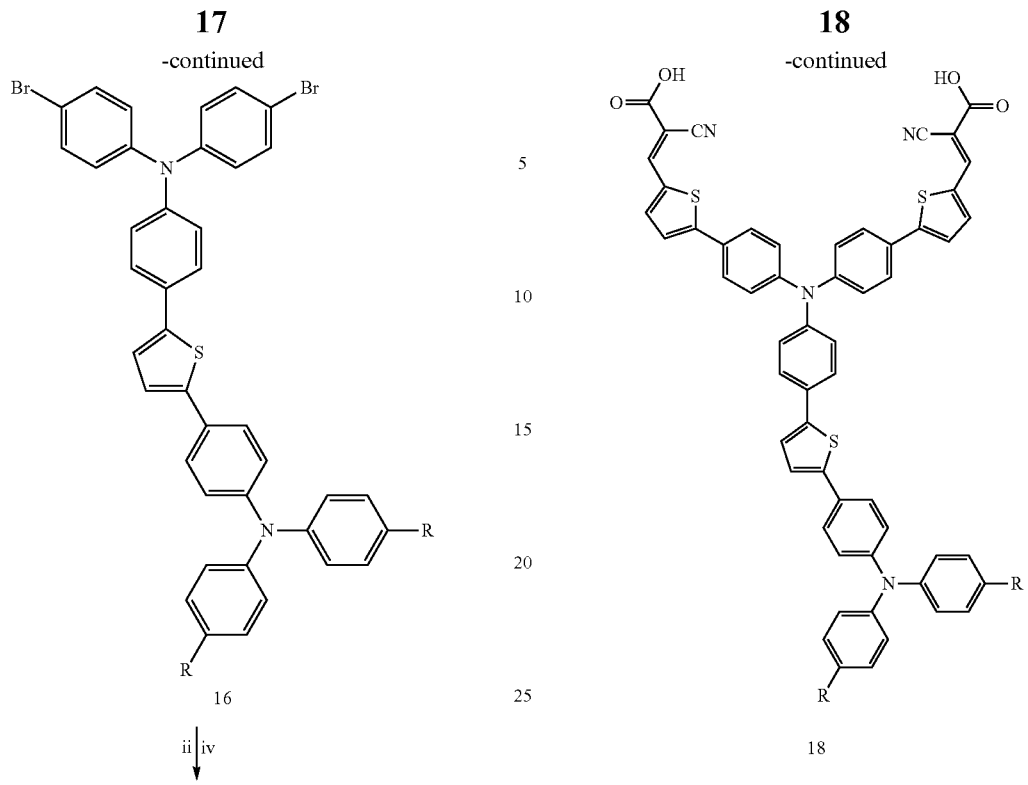

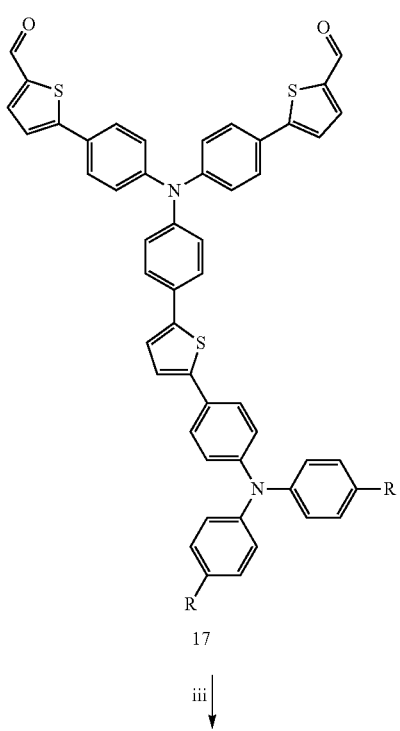

Wherein R is defined above.

In one alternative, the reaction conditions of the synthesis of said dyes comprise I) N-bromosuccinimide (1.10 eq), THF-EtOAc (1:1), 2 days; II) Pd(PPh$_3$)$_4$ (0.10 eq), NaOH (8 eq), THF:water (9:1), reflux 12 hours; III) cyanoacetic acid (4 eq), piperidine (0.25 eq), CHCl$_3$, reflux 8 hours; IV) acetic acid:water (2:1), reflux 12 hours; V) 1) n-BuLi (1.2 eq) dropwise, −78° C. dry THF 2) −78° C. 15 min 3) boronic ester (2 eq) one portion, −78° C. 4) MeOH quench; VI) Ethylene glycol (3 mL), p-TsOH (0.2 eq), toluene (50 mL), Dean-Stark, reflux overnight.

According to another aspect, there is provided bichromic bipodal triphenylamine based dyes 4a 9a, 13a and 18a wherein 4a (in which n=0, m=0, and R=OMe), 9a (in which n=1, m=0, and R=OMe), 13a (in which n=0, m=1, and R=OMe), and 18a (in which n=1, m=1, and R=OMe).

According to yet another aspect, there is provided the use of bichromic bipodal triphenylamine based dyes, in a preferred alternative 4a, 9a, 13a, and 18a in a DSSC device. According to yet another aspect, there is provided the use of bichromic bipodal triphenylamine based dyes wherein R=H, SMe or O Me in a DSSC device. According to yet another aspect, there is provided the use of said dyes in a DSSC device to absorb light which is then converted to electric current. In one aspect use of said dye in a DSSC device results in acceptable operation at about 1 sun (100 mWcm$^{-2}$). In another aspect use of said dyes in a DSSC device result in substantial increased efficiencies (nearly 4-fold) at diffuse light levels lower than about 100 mWcm$^{-2}$), more preferably at about 25 mWcm$^{-2}$ to 5 mWcm$^{-2}$. Even more preferably lower than from about 10 mWcm$^{-2}$ According to yet another aspect, there is provided a group of dyes selected from four architectures, 4, 9, 13 and 18 as depicted herein. Each of these architectures may be appended with different groups as described herein, and all demonstrate improved performance in diffuse light. These dyes comprise two triphenylamine units connected directly to each other or connected to each other via an intermediary unit of a different architecture, wherein one triphenylamine unit is appended with two cyanoacetic acid groups and the other triphenyl amine unit is appended with at least one R group, preferably a plurality of R groups as defined herein.

In architecture 4, the two triphenylamine units are connected directly to one another.

In architecture 9, there is a thiophene unit connecting the two triphenylamine units together.

In architecture 13, the two triphenylamine units are also connected directly to one another as in 4, but there is a thiophene unit between each of the cyanoacetic acid groups and the triphenylamine units.

In architecture 18 there is a thiophene unit connecting the two triphenylamine units together and a thiophene unit between each of the cyanoacetic acid groups and the triphenylamine unit.

In yet a further aspect, the dye molecules are used in a DSSC as follows: a solution, in one alternative a 0.25-0.5 mM solution, of a dye molecule is prepared in a solvent (which allows the dye to dissolve and permit surface adsorption), in one alternative a polar solvent, in another alternative a polar protic solvent, in another alternative said solvent is an alcohol, in yet another alternative said alcohol is ethanol. In addition to the dye, the solution contains a surface passivator ranging from 0-10 equivalents relative to the dye. In one alternative the passivator can be deoxycholic acid. A transparent conductive oxide, in one alternative fluorine doped tin oxide (FTO), and in another alternative indium doped tin oxide (ITO), coated glass substrate with a transparent semiconductor film, in one alternative titania, (anode) is then submerged in the dye molecule solution and left until we observe maximum adsorption of said dye onto said titania surface, in another alternate until the dye saturates the titania surface. In one alternative for approximately 16 hours. The anode is then rinsed with the solvent it was dipped in to remove any residual dye solution from the anode so as not to impede or interfere with the sealing of the DSSC in later steps and sealed together with a surface modified counter electrode, in one alternative modified with platinum, by heating and melting a low temperature melting polymer based spacer that is resistant to any components of the chosen electrolyte mixture, in one alternative a Surlyn material, in between the anode and cathode. An electrolyte, any liquid electrolyte that is widely used in DSSC technology, in one alternative a Z1137 iodide electrolyte, is then injected through a fill hole on the platinum coated counter electrode (cathode) and the fill hole is then sealed by layering a thin piece of glass on top of Surlyn and melting the Surlyn to form a seal. A conducting metal paste, in one alternative silver paste, is then applied to the outermost edges of the anode (in one alternative the outermost 0.5 cm of each electrode is coated with enough paste to cover the surface, so there is no glass visible through the paste) and the cathode thick enough so that the electrode below can not be seen through the paste, and allowed to dry. According to yet another aspect, the bichromic bipodal triphenylamine based dyes have the following structures

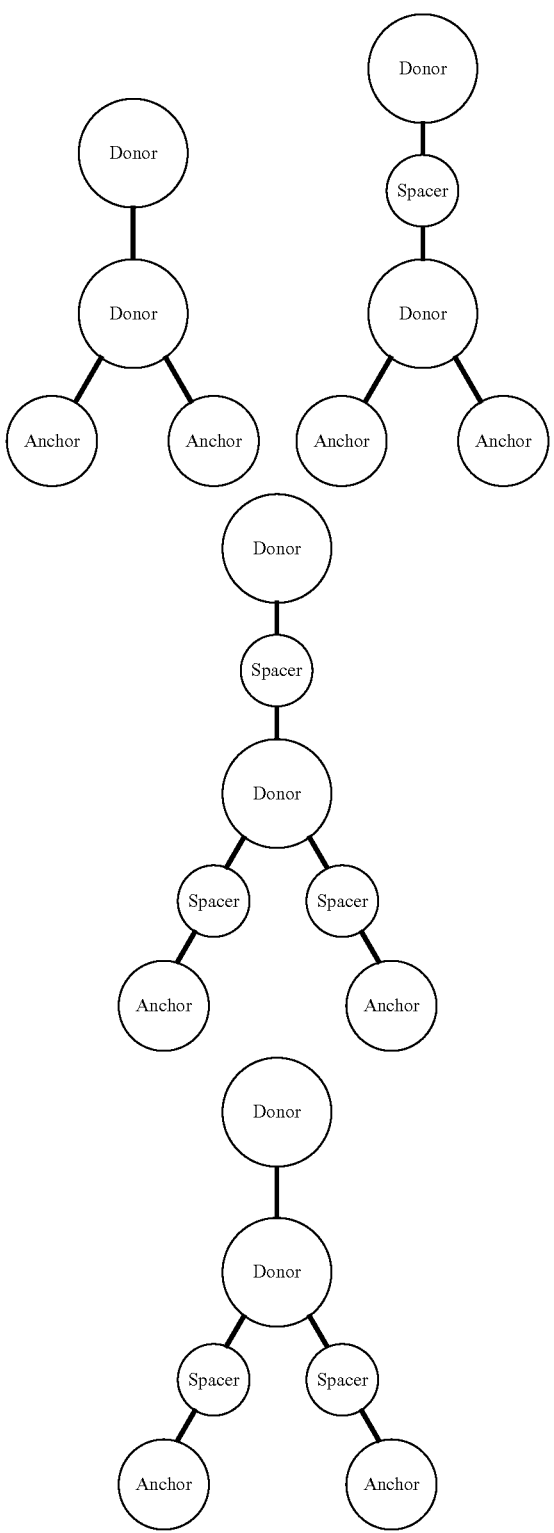

Wherein in one alternative the Donor (D) is selected from a redox-active donor/chromophore (D) that is coupled through a p-spacer to an acceptor (A) capable of anchoring strongly to a semiconductor (usually $TiO_2$); the Anchor (A) is selected from acceptor/anchoring groups are comprised of electron-withdrawing carboxylic acid derivatives, that are conjugated to the p-spacer. Redox-active donors tend to be electron-rich, robustly stable to oxidation, and intensely absorbing conjugated molecules; the Spacer is selected from a p-conjugated spacer for manipulating the properties of the dye molecule, as adjusting the length of the spacer tunes the energy of the frontier molecular orbitals and concomitantly shifts the absorption profile on demand for the desired application.

DETAILED DESCRIPTION

Figure 1:
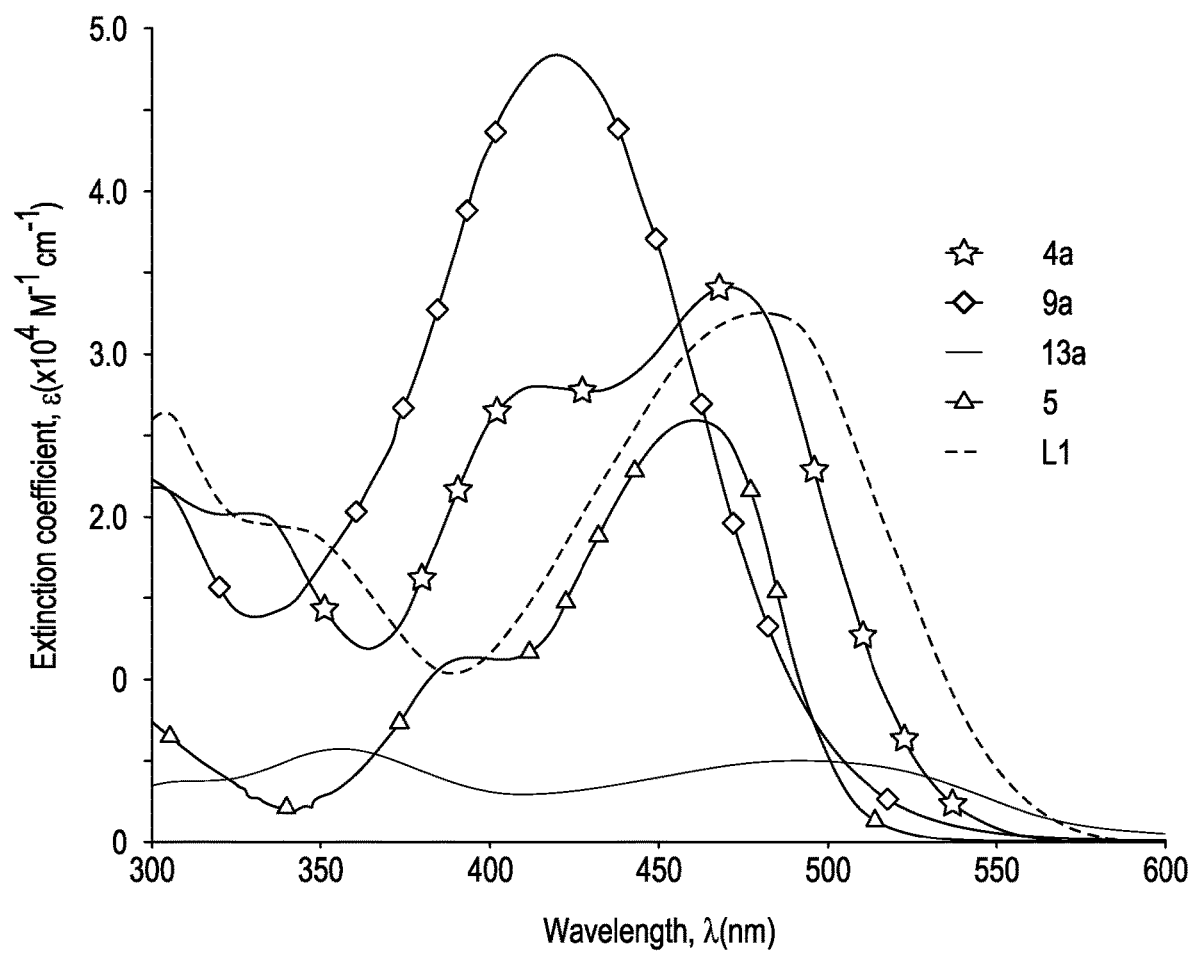
FIG. 1 provides a plot of wavelength versus extinction of coefficient of several dyes described herein.

The following provides examples of the bichromic bipodal triphenylamine dyes described herein.

Synthesis of Compound 2:

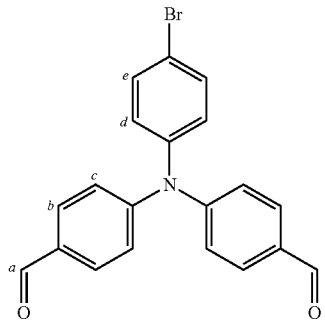

Compound 2

Under an atmosphere of $N_2$, diformylTPA (2.83 g, 9.41 mmol) was dissolved in 75 mL of THF:EtOAc (1:1) and N-bromosuccinimide (1.84 g, 10.4 mmol) was added in one portion. The flask was covered with Al foil and the mixture was stirred overnight. Volatiles were removed in vacuo and the crude was purified via column chromatography over silica using hexanes:EtOAc (3:2) as the eluent, affording the desired product as a yellow-green solid (2.33 g, 65%). 1H NMR (400 MHz, chloroform-d3): δ=9.91 (a, s, 2H), 7.79 (b, d, 4H, 3JHH=8 Hz), 7.50 (d, d, 2H, 3JHH=8 Hz), 7.18 (c, d, 4H, 3JHH=8 Hz), 7.05 (e, d, 2H, 3JHH=8 Hz).

Synthesis of Compound 3a:

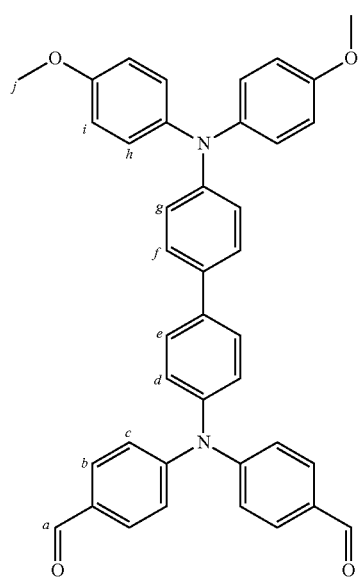

Compound 3a

Under an atmosphere of $N_2$, compound 2 (0.282 g, 0.74 mmol) was dissolved in 60 mL of THF:$H_2O$ (9:1) and compound B (0.42 g, 0.97 mmol) was added into the same flask. The flask was sparged for 15 minutes. The flask was charged with Pd(PPh$_3$)$_4$ (10 mol %) followed by NaOH (8 eq) and refluxed at the solvents boiling point overnight. Volatiles were removed in vacuo and an extraction with DCM was performed. The crude was purified via column chromatography over silica using using a gradient elution from DCM to hexanes:EtOAc (3:2) affording the desired product as a yellow solid (0.251 g, 47%). 1H NMR (400 MHz, chloroform-d3): δ=9.90 (a, s, 2H), 7.79 (b, d, 4H, 3JHH=8 Hz), 7.56 (e, d, 2H, 3JHH=8 Hz), 7.40 (f, d, 2H, 3JHH=8 Hz), 7.23 (c, d, 4H, 3JHH=8 Hz), 7.18 (d, 2H, 3JHH=8 Hz), 7.09 (h, d, 4H, 3JHH=8 Hz), 6.98 (g, 2H, 3JHH=8 Hz), 6.85 (i, d, 4H, 3JHH=8 Hz), 3.81 (j, s, 6H).

Synthesis of Compound 4a:

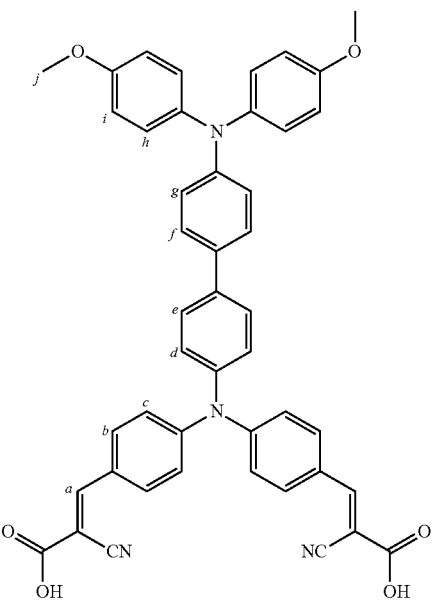

Compound 4a

Compound 3a (0.233 g, 0.38 mmol) was dissolved in a minimal amount of CHCl$_3$ and cyanoacetic acid. 2 drops of piperidine was then added. The mixture was refluxed at the solvents boiling point overnight. The organic layer was washed with HCl 1 N and volatiles removed in vacuo, in one alternative at a pressure of 30 mbar. The crude was recrystallized in DCM:hexane (1:1) as a crimson red solid (0.091 g, 39%); IR (cm−1) 2229, 1720. 1H NMR (400 MHz, dimethylsulfoxide-d6): δ 8.21 (a, s, 2H), 8.01 (b, d, 4H, 3JHH=8 Hz), 7.66 (e, d, 2H, 3JHH=8 Hz), 7.51 (f, d, 2H, 3JHH=8 Hz), 7.22 (d, d, 2H, 3JHH=8 Hz), 7.19 (c, d, 4H, 3JHH=8 Hz), 7.05 (i, d, 4H), 6.92 (h, d, 4H, 3JHH=8 Hz), 6.81 (g, d, 2H, 3JHH=8 Hz) 3.75 (s, 6H). 13C{1H} NMR (100 MHz, dimethylsulfoxide-d6) δ=163.70, 155.93, 152.99, 149.92, 148.05, 143.05, 139.83, 137.88, 132.73, 130.37, 127.61, 127.24, 126.95, 125.99, 122.60, 119.09, 116.63, 115.01, 55.25. HRMS (ESI): m/z 737.24194 ((M−H]−) calculated for C$_{46}$H$_{34}$N$_4$O$_6$: m/z 737.24056.

Synthesis of Compound 6:

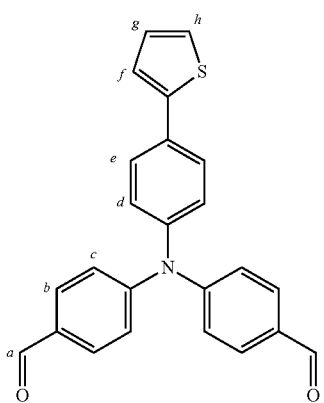

Compound 6

Under an atmosphere of N$_2$, compound A (2.00 g, 5.26 mmol) was dissolved in 60 mL of THF:H$_2$O (9:1) and compound 2 (1.105 g, 5.26 mmol) was added into the same flask. The flask was sparged for 15 minutes and then charged with Pd(PPh$_3$)$_4$ (10 mol %) followed by NaOH (8 eq) and refluxed at the solvents boiling point overnight. Volatiles were removed in vacuo, in one alternative at 30 mbar, and an extraction with DCM was performed. The crude was purified via column chromatography over silica using hexanes:EtOAc (3:2) affording the desired product as a neon yellow, waxy oil. (1.0381 g, 51%). 1H NMR (400 MHz, chloroform-d3): δ=9.91 (a, s, 2H), 7.79 (b, d, 4H, 3JHH=8 Hz), 7.62 (e, d, 2H, 3JHH=8 Hz), 7.31 (d, d, 2H, 3JHH=8 Hz), 7.22 (c, 4H, 3JHH=8 Hz), 7.17 (f+h, d, 2H, 3JHH=8 Hz), 7.10 (g, t, 1H, 3JHH=8 Hz).

Synthesis of Compound 7:

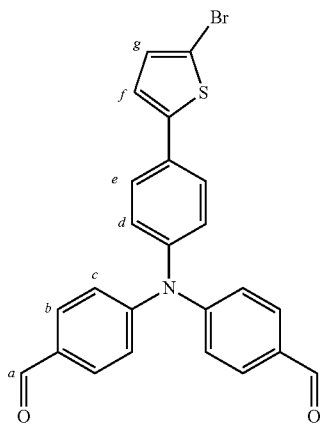

Compound 7

Under an atmosphere of N$_2$, compound 6 (0.30 g, 0.79 mmol) was dissolved in 75 mL of THF:EtOAc (1:1) and N-bromosuccinimide (0.16 g, 0.9 mmol) was added in one portion in a flask. The flask was covered with Al foil and the mixture was stirred at roughly 300 rpm with a magnetic stir plate at room temperature overnight. Volatiles were removed in vacuo, in one alternative at 30 mbar, and the crude was purified via column chromatography over silica using hexanes:EtOAc (3:1) as the eluent, affording the desired product as a yellow waxy solid. (0.201 g, 57%). 1H NMR (400 MHz, chloroform-d3): δ=9.91 (a, s, 2H), 7.79 (b, d, 4H, 3JHH=8 Hz), 7.51 (d, d, 2H, 3JHH=8 Hz), 7.22 (c, d, 4H, 3JHH=8 Hz), 7.16 (e, d, 2H, 3JHH=8 Hz), 7.04 (f+g, s, 2H).

Synthesis of Compound 8a:

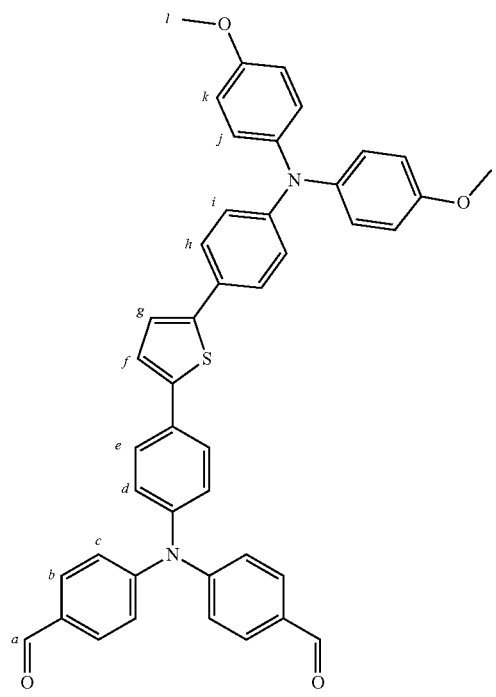

Compound 8a

Under an atmosphere of N$_2$, compound 7 (0.622 g, 1.34 mmol) was dissolved in 60 mL of THF:H$_2$O (9:1) and compound B (0.638 g, 1.48 mmol) was added into the same flask. The flask was sparged for 15 minutes. The flask was charged with Pd(PPh$_3$)$_4$ (10 mol %) followed by NaOH (8 eq) and refluxed at the solvents boiling point overnight. Volatiles were removed in vacuo, in one alternative at 30 mbar, and an extraction with DCM was performed. The crude was purified via column chromatography over silica using hexanes:EtOAc (3:1) affording the desired product as a yellow solid. (0.361 g, 39%). 1H NMR (400 MHz, chloroform-d3): δ=9.90 (a, s, 2H), 7.79 (b, d, 4H, 3JHH=8 Hz), 7.61 (f+g, d, 2H, 3JHH=8 Hz), 7.43 (d, d, 2H, 3JHH=8 Hz), 7.23 (c, d, 4H, 3JHH=8 Hz), 7.16 (h+e, d, 4H, 3JHH=8 Hz), 7.08 (k, d, 4H), 6.92 (i, d, 2H, 3JHH=8 Hz), 6.85 (j, d, 4H, 3JHH=8 Hz), 3.81 (s, 6H). 13C{1H} NMR (100 MHz, CDCl3) δ 190.62, 156.21, 151.91, 148.58, 144.58, 144.42, 140.88, 140.67, 132.52, 131.59, 131.49, 127.24, 126.86, 126.40, 126.20, 124.42, 123.08, 122.80, 120.50, 114.89, 55.63.

Synthesis of 9a:

Compound 9a

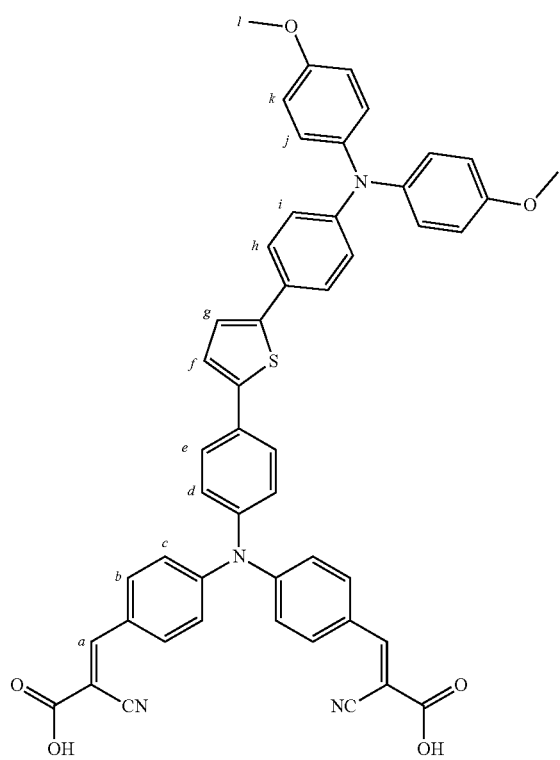

Compound 8a (0.434 g, 0.632 mmol) was dissolved in a minimal amount of CHCl$_3$ and cyanoacetic acid. 2 drops of piperidine was then added. The mixture was refluxed at the solvents boiling point overnight. The organic layer was washed with HCl 1 N and volatiles removed in vacuo. The crude was recrystallized in DCM:hexane (1:1) as a crimson red solid (0.217 g, 50%). IR (cm−1) 2223.819, 1695.602. 1H NMR (400 MHz, dimethylsulfoxide-d6): δ=8.22 (a, s, 2H), 8.01 (b, d, 4H, 3JHH=8 Hz), 7.70 (e, d, 2H, 3JHH=8 Hz), 7.47 (h+g, m, 3H), 7.32 (fid, 1H, 3JHH=8 Hz), 7.19 (c+d, m, 6H), 7.03 (k, d, 4H, 3JHH=8 Hz), 6.91 (j, d, 4H, 3JHH=8 Hz), 6.77 (I, d, 2H, 3JHH=8 Hz), 3.74 (l, s, 6H). 13C{1H} NMR (100 MHz, CDCl3) δ 163.67, 155.93, 152.98, 149.75, 148.08, 143.67, 143.28, 140.05, 139.69, 132.72, 131.53, 127.21, 126.82, 126.67, 126.15, 126.10, 125.09, 123.30, 122.79, 119.23, 116.56, 114.99, 100.70, 55.23, 30.65. HRMS (ESI): m/z 819.22961 ((M−H]−) calculated for C$_{50}$H$_{36}$N$_4$O$_6$S: m/z 819.22828.

Synthesis of Compound 11a:

Compound 11a

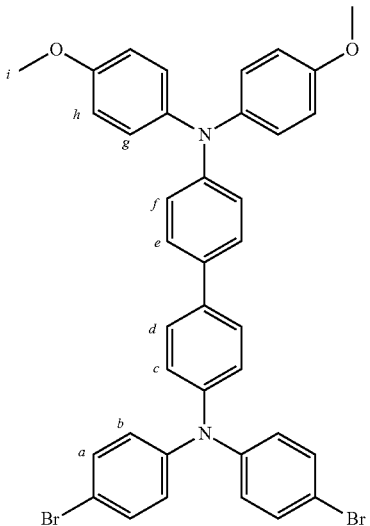

Under an atmosphere of N$_2$, para-tribromo-triphenylamne (1.5 g, 3.11 mmol) was dissolved in 150 mL of THF:H$_2$O (9:1) and compound B (1.475 g, 3.42 mmol) was added into the same flask. The flask was sparged for 15 minutes. The flask was charged with Pd(PPh$_3$)$_4$ (10 mol %) followed by NaOH (8 eq) and refluxed at the solvents boiling point overnight. Volatiles were removed in vacuo and an extraction with DCM was performed. The crude was purified via column chromatography over silica using hexanes:EtOAc (7:3) affording the desired product as a white solid. (0.410 g, 19%). 1H NMR (400 MHz, chloroform-d3): δ=7.44 (d, d, 2H, 3JHH=8 Hz), 7.39-7.33 (a+d, m, 6H), 7.08 (b+c, d, 6H, 3JHH=8 Hz), 6.97 (h, d, 4H, 3JHH=8 Hz), 6.84 (f+g, d, 6H, 3JHH=8 Hz), 3.80 (l, s, 6H). HRMS (ESI): m/z 706.0657 calculated for C$_{48}$H$_{36}$N$_2$O$_4$S$_2$: m/z 706.07.

Synthesis of Compound 12a:

Compound 12a

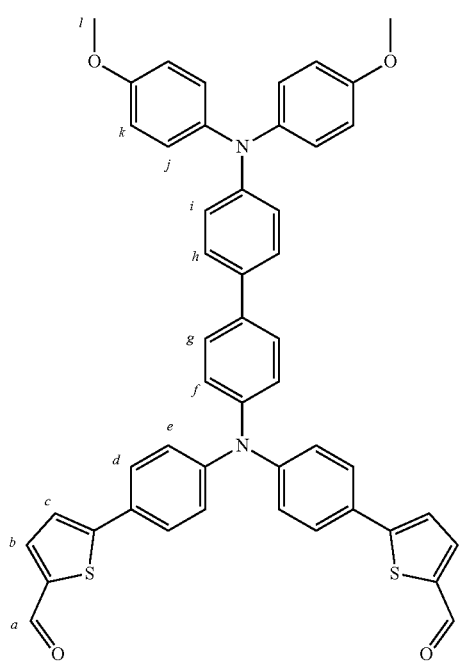

Under an atmosphere of N$_2$, compound 11a (0.410 g, 0.58 mmol) was dissolved in 60 mL of THF:H$_2$O (9:1) and compound C (0.344 g, 1.22 mmol) was added into the same flask. The flask was sparged for 15 minutes. The flask was charged with Pd(PPh$_3$)$_4$ (10 mol %) followed by NaOH (8 eq) and refluxed at the solvents boiling point overnight. Volatiles were removed in vacuo and an extraction with DCM was performed. The crude was purified via column chromatography over silica using hexanes:EtOAc (7:3) affording the desired product as a red solid. (0.023 g, 5%). 1H NMR (400 MHz, chloroform-d3): δ=9.87 (a, s, 2H), 7.72 (b, d, 2H, 3JHH=8 Hz), 7.58 (d, d, 4H, 3JHH=8 Hz), 7.51 (c, d, 2H, 3JHH=8 Hz), 7.40 (g, d, 2H, 3JHH=8 Hz), 7.34 (h, d, 2H, 3JHH=8 Hz), 7.18 (e+f, m, 6H, 3JHH=8 Hz), 7.09 (j, d, 4H, 3JHH=8 Hz), 6.99 (i, d, 2H, 3JHH=8 Hz), 6.85 (k, d, 4H, 3JHH=8 Hz), 3.81 (l, s, 6H). HRMS (ESI): m/z 768.211110 calculated for C$_{48}$H$_{36}$N$_2$O$_4$S$_2$: m/z 768.21.

Synthesis of Compound 13a:

Compound 13a

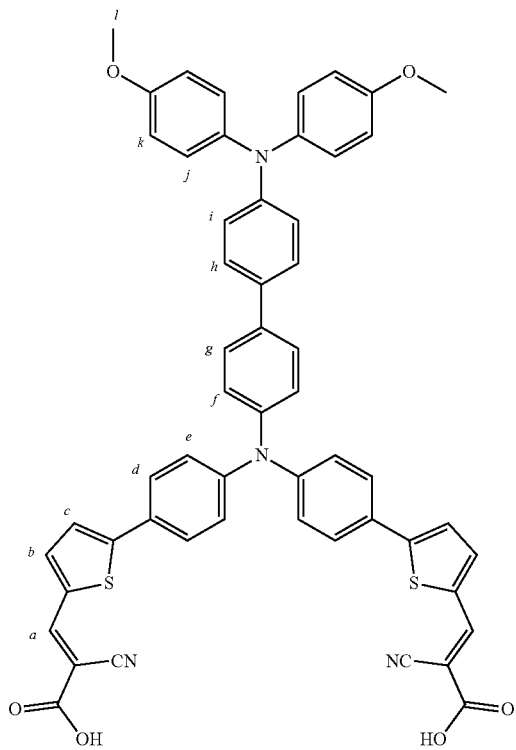

Compound 12a (0.027 g, 0.03 mmol) was dissolved in a minimal amount of CHCl$_3$ and cyanoacetic acid. Piperidine was then added. The mixture was refluxed at the solvents boiling point and monitored via thin layer chromatography. The organic layer was washed with HCl 1 N and volatiles removed in vacuo. The crude was recrystallized in DCM:hexane (1:1) as a crimson red solid (0.023 g, 84%). IR (cm-1) 2222.788, 1649.201. 1H NMR (400 MHz, dimethylsulfoxide-d6): δ=8.44 (a, s, 2), 8.00 (b, m, 2H), 7.81 (d, d, 4H, 3JHH=8 Hz), 7.67 (e, d, 4H, 3JHH=8 Hz), 7.54 (c, d, 2H, 3JHH=8 Hz), 7.30-7.23 (g+h, m, 6H, 3JHH=8 Hz), 7.10 (k, d, 4H, 3JHH=8 Hz), 6.93 (j+i, d, 6H, 3JHH=8 Hz), 3.80 (l, s, 6H). 13C{1H} NMR (100 MHz, dimethylsulfoxide-d6) δ 200.01, 155.86, 147.16, 147.16, 144.51, 139.98, 135.90, 135.90, 135.13, 135.13, 130.85, 130.85, 129.30, 127.26, 127.03, 126.80, 125.44, 125.43, 123.95, 123.73, 119.46, 118.80, 115.02, 55.29, 43.68, 30.71, 22.20, 21.72.

Synthesis of Compound 5:

Compound 5

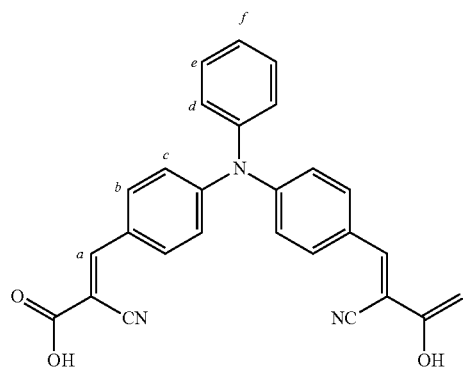

DiformylTPA (0.950 g, 3.15 mmol) was dissolved in a minimal amount of CHCl$_3$ and cyanoacetic acid. 2 drops of piperidine was then added. The mixture was refluxed at the solvents boiling point and monitored via thin layer chromatography. The organic layer was washed with HCl 1 N and volatiles removed in vacuo. The crude was recrystallized in DCM:hexane (1:1) as a dark orange solid (0.026 g, 0.019%). IR (cm-1) 2217.502, 1699.994. 1H NMR (400 MHz, dimethylsulfoxide-d6): δ=8.22 (a, s, 2), 8.01 (b, d, 2H, 3JHH=8 Hz), 7.48 (e, t, 2H, 3JHH=8 Hz), 7.33 (f, t, 1H, 3JHH=8 Hz), 7.23 (d, d, 2H, 3JHH=8 Hz), 7.16 (c, d, 4H, 3JHH=8 Hz). 13C{1H} NMR (100 MHz, dimethylsulfoxide-d6) δ 163.95, 154.21, 152.60, 150.28, 133.76, 132.19, 132.15, 129.22, 126.18, 126.10, 123.50, 123.45, 121.89, 121.84, 116.94, 116.80, 100.75.

Based on the tables below, it is observed that the present dye in DSSC has 1) increased panchromatic absorption into the near-IR as observed in the UV-Vis spectra displayed below; 2) improved redox stability and dye lifetime as a result of the incorporation of two redox robust donor units; and 3) improved electronic communication between interfaces as a result of the bipodal structure of the dye relative to the previously published benchmark dye L1 pictured below (Hagberg, D. P.; Marinado, T.; Karlsson, K. M.; Nonomura, K.; Qin, P.; Boschloo, G.; Brinck, T.; Hagfeldt, A.; Sun, L. *J. Org. Chem.* 2007, 72 (25), 9550-9556).

L1

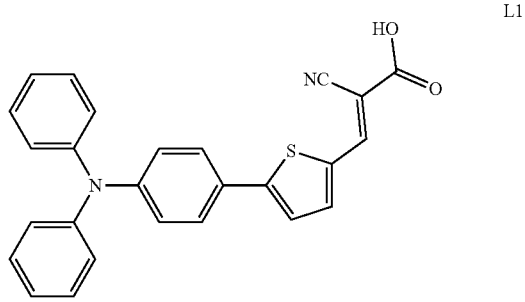 [SMILES: N#C/C(=C\c1ccc(-c2ccc(N(c3ccccc3)c3ccccc3)cc2)s1)C(=O)O]

Referring now to FIG. 1, there is shown an Ultraviolet visible (UV-Vis) spectra of dyes L1, 5, 13a, 9a and 4a collected in dichloromethane (DCM).

Figure 2:
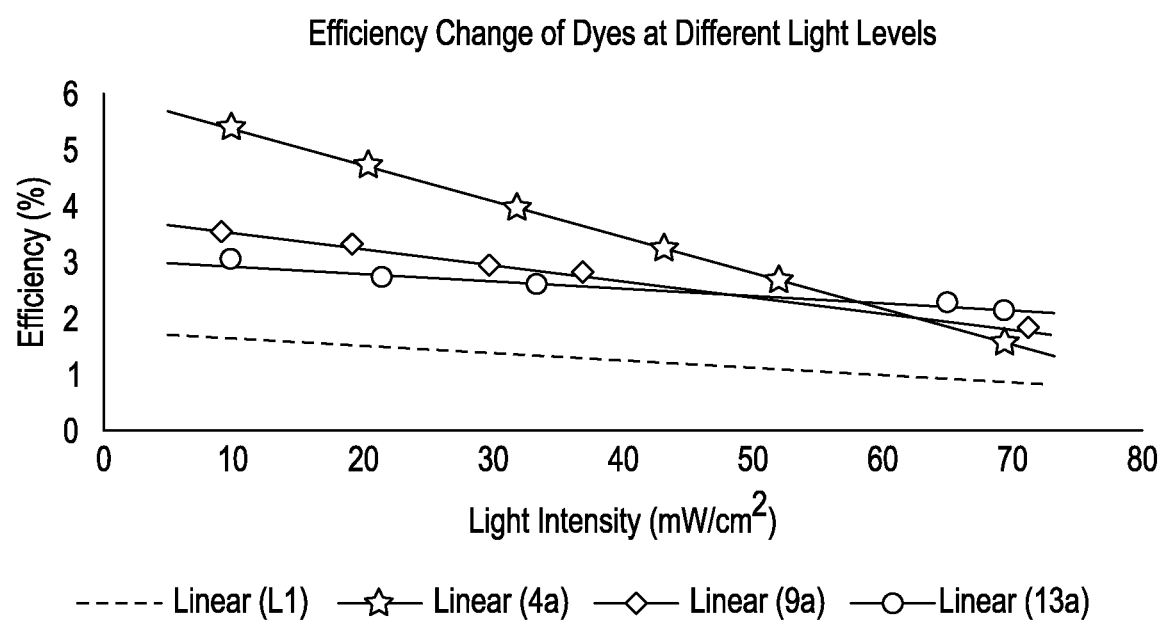
FIG. 2 provides a plot of light intensity versus % efficiency of several dyes described herein at different light levels.

Referring now to FIG. 2, there is shown efficiencies of dyes L1, 4a, 9a and 13a at high and low light intensities and the percent change in efficiency. This is tabulated below.

| Dye | Efficiency at 73 mW/cm$^2$ (%) | Efficiency at 5 mW/cm$^2$ (%) | Change from High to Low Light (%) |
|---|---|---|---|
| L1 | 1.7 ± 0.80 | 0.8 ± 0.42 | 103 |
| 4a | 1.33 | 5.69 | 367 |
| 9a | 1.7 ± 0.28 | 3.7 ± 0.65 | 250 |
| 13a | 2.1 ± 0.18 | 3.0 ± 0.41 | 199 |

Note that all tests were carried out in triplicate at a minimum except when standard deviation is not reported, in which case testing was carried out in duplicate.

Figure 3:
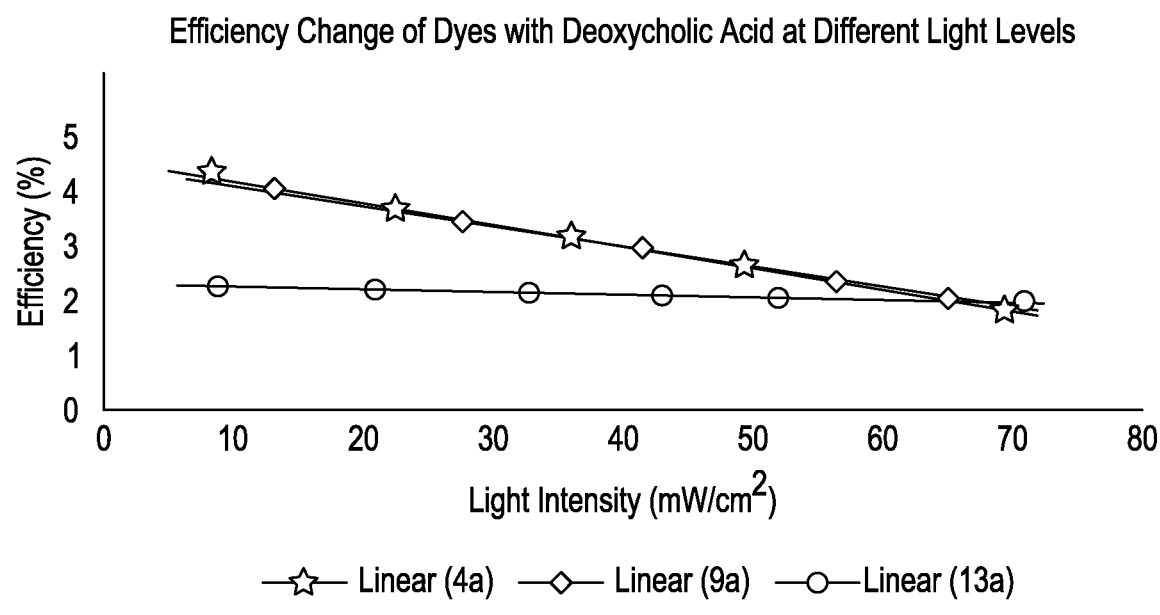
FIG. 3 provides a plot of light intensity versus efficiency of several dyes described herein with deoxycholic acid at different light levels.

Referring now to FIG. 3 there is shown efficiencies of dyes 4a, 9a and 13a with added deoxycholic acid at high and low light intensities and the percent change in efficiency. The results are tabulated below.

| Dye | Efficiency at 73 mW/cm$^2$ (%) | Efficiency at 5 mW/cm$^2$ (%) | Change from High to Low Light (%) |
|---|---|---|---|
| 4a | 1.7 ± 0.84 | 4.4 ± 0.88 | 380 |
| 9a | 1.80 | 4.31 | 392 |
| 13a | 2.0 ± 0.57 | 2.3 ± 0.75 | 143 |

In the table below, open circuit voltage ($V_{oc}$) is defined as the point where current drops to zero, short circuit current ($J_{sc}$) is defined as the maximum current generated, fill factor (FF) is a measure of the squareness of the curve, and the incident power ($P_{in}$) is the power of the light used to test the solar cell. These values are used to determine efficiency from the following relationship, $$\eta = \frac{V_{oc} \times J_{sc} \times FF}{P_{in}}$$

in which $V_{oc}$ is measured in volts (V), $J_{sc}$ is measured in milliamperes per centimeter squared (mA/cm$^2$), FF is unitless, and $P_{in}$ is measured in milliwatts per centimeter squared (mW/cm$^2$).

| Voc (V) | Jsc (mA/cm^2) | FF | Pin (mW/cm^2) | Efficiency (%) | Average Efficiency (%) | Std. Dev. | Dye/Light |
|---|---|---|---|---|---|---|---|
| 0.615 | 4.272 | 0.647 | 72.9138 | 2.331315 | 1.660343 | 0.77311 | L1/High |
| 0.582 | 3.5024 | 0.622 | 72.9138 | 1.738879 | | | |
| 0.525 | 1.4344 | 0.453 | 72.9138 | 0.467862 | | | |
| 0.602 | 4.66 | 0.674 | 72.9138 | 2.59318 | | | |
| 0.546 | 2.9492 | 0.53 | 72.9138 | 1.170477 | | | |
| 0.448 | 0.2546 | 0.422 | 4.7431 | 1.014814 | 0.767369 | 0.41654 | L1/Low |
| 0.389 | 0.1618 | 0.444 | 4.7431 | 0.589035 | | | |
| 0.351 | 0.042 | 0.874 | 4.7431 | 0.271647 | | | |
| 0.454 | 0.4192 | 0.361 | 4.7431 | 1.448511 | | | |
| 0.365 | 0.1579 | 0.422 | 4.7431 | 0.512838 | | | |
| 0.576 | 1.856 | 0.368 | 72.9138 | 0.539559 | 1.694332 | 0.83466 | 4a + DCA/High |
| 0.633 | 4.128 | 0.693 | 72.9138 | 2.483516 | | | |
| 0.592 | 3.5484 | 0.715 | 72.9138 | 2.059921 | | | |
| 0.628 | 3.0648 | 0.483 | 72.9138 | 1.274968 | 1.333435 | | 4a/High |
| 0.617 | 3.0688 | 0.536 | 72.9138 | 1.391903 | | | |
| 0.517 | 0.42 | 0.717 | 4.7431 | 3.282437 | 4.366019 | 0.88331 | 4a + DCA/Low |
| 0.562 | 0.6492 | 0.708 | 4.7431 | 5.446098 | | | |
| 0.533 | 0.5312 | 0.732 | 4.7431 | 4.36952 | | | |
| 0.578 | 0.7336 | 0.744 | 4.7431 | 6.651162 | 5.686032 | | 4a/Low |
| 0.561 | 0.5372 | 0.743 | 4.7431 | 4.720903 | | | |
| 0.529 | 4.596 | 0.599 | 72.9138 | 1.997344 | 1.796431 | | 9a + DCA/High |
| 0.525 | 3.1476 | 0.704 | 72.9138 | 1.595518 | | | |
| 0.584 | 2.2828 | 0.701 | 72.9138 | 1.281708 | 1.70936 | 0.27617 | 9a/High |
| 0.643 | 3.2776 | 0.697 | 72.9138 | 2.014605 | | | |
| 0.632 | 2.942 | 0.735 | 72.9138 | 1.874293 | | | |
| 0.619 | 2.5532 | 0.769 | 72.9138 | 1.666833 | | | |
| 0.471 | 0.42 | 0.812 | 4.7431 | 3.386598 | 4.313371 | | 9a + DCA/Low |
| 0.468 | 0.71 | 0.748 | 4.7431 | 5.240144 | | | |
| 0.523 | 0.42 | 0.594 | 4.7431 | 2.7509 | 3.66525 | 0.64797 | 9a/Low |
| 0.588 | 0.42 | 0.844 | 4.7431 | 4.39447 | | | |
| 0.576 | 0.42 | 0.812 | 4.7431 | 4.141572 | | | |
| 0.562 | 0.42 | 0.678 | 4.7431 | 3.374059 | | | |
| 0.493 | 2.6276 | 0.699 | 72.9138 | 1.241863 | 1.956097 | 0.56854 | 13a + DCA/High |
| 0.53 | 4.36 | 0.629 | 72.9138 | 1.993441 | | | |
| 0.639 | 4.144 | 0.725 | 72.9138 | 2.632988 | | | |
| 0.544 | 4.528 | 0.681 | 72.9138 | 2.300609 | 2.077432 | 0.17596 | 13a/High |
| 0.578 | 3.5644 | 0.662 | 72.9138 | 1.870521 | | | |
| 0.543 | 3.9996 | 0.692 | 72.9138 | 2.061165 | | | |
| 0.422 | 0.3222 | 0.459 | 4.7431 | 1.315958 | 2.334279 | 0.74598 | 13a + DCA/Low |
| 0.455 | 0.42 | 0.765 | 4.7431 | 3.082191 | | | |
| 0.555 | 0.42 | 0.53 | 4.7431 | 2.604687 | | | |

-continued

| Voc (V) | Jsc (mA/cm^2) | FF | Pin (mW/cm^2) | Efficiency (%) | Average Efficiency (%) | Std. Dev. | Dye/Light |
|---|---|---|---|---|---|---|---|
| 0.479 | 0.42 | 0.732 | 4.7431 | 3.104798 | 3.030841 | 0.40724 | 13a/Low |
| 0.504 | 0.42 | 0.56 | 4.7431 | 2.499224 | | | |
| 0.49 | 0.42 | 0.804 | 4.7431 | 3.488501 | | | |
| 0.558 | 1.0588 | 0.607 | 68.3966 | 0.524327 | 0.345444 | 0.21025 | 5 + DCA/High |
| 0.555 | 0.942 | 0.604 | 68.3966 | 0.461686 | | | |
| 0.137 | 0.8972 | 0.28 | 68.3966 | 0.050319 | | | |
| 0.184 | 0.6468 | 0.268 | 68.3966 | 0.046632 | 0.305319 | 0.19918 | 5/High |
| 0.563 | 1.0276 | 0.628 | 68.3966 | 0.5312 | | | |
| 0.509 | 0.778 | 0.584 | 68.3966 | 0.338124 | | | |

Based on the table above, it is observed that the present dyes in the DSSC have 1) increased panchromatic absorption leading to improved performance at lower light levels; 2) Added redox stability and optimal electron injection kinetics owing to the incorporation of two redox robust triphenylamine donor units; and 3) improved electronic communication between interfaces as a result of the bipodal structure of the dye.

Note that all DSSCs described in the table above were made with the Z1137 electrolyte.

As many changes can be made to the alternatives without departing from the scope thereof; it is intended that all matter contained herein be considered illustrative and not in a limiting sense.

The invention claimed is:

1. A bichromic bipodal triphenylamine-based dye selected from the group consisting of:

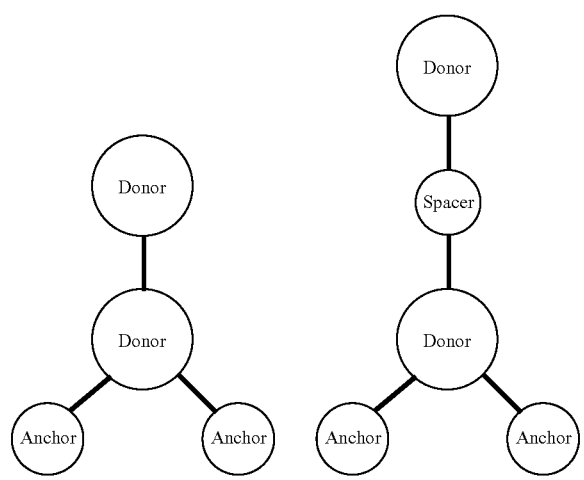

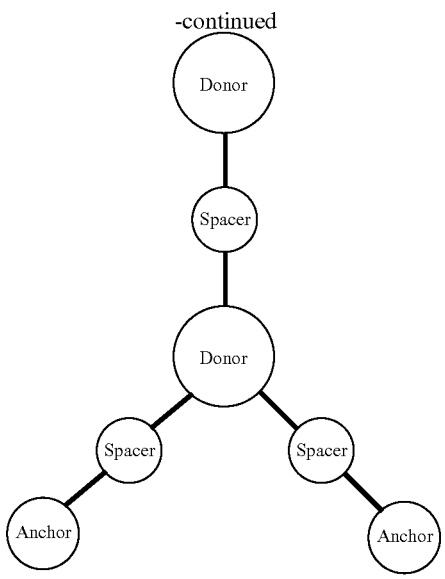

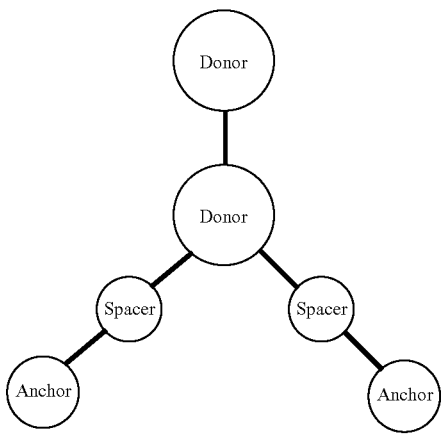

wherein Donor (D) is a triphenylamine that is coupled through a p-spacer to an acceptor (A) capable of anchoring strongly to a semiconductor; wherein Anchor (A) is selected from acceptor/anchoring groups comprising electron-withdrawing carboxylic acid derivatives, conjugated to the p-spacer; and wherein p-spacer is selected from a p-conjugated spacer.

2. A bichromic bipodal triphenyl amine based dye of formula:

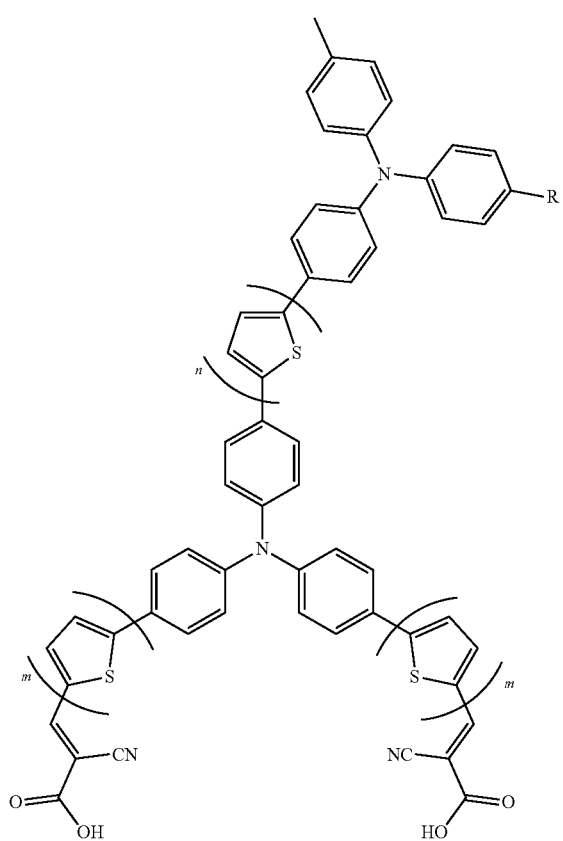
Genaric Bichromic Bipedal Dye Structure
| n | 0 | 1 | 0 | 2 | 2 | 2 | 0 | 1 | 3 | 3 | 3 | 3 | 0 | 1 | 2 |
| m | 0 | 0 | 1 | 0 | 1 | 2 | 2 | 2 | 0 | 1 | 2 | 3 | 3 | 3 | 3 |
Wherein R is selected from O—CH$_3$
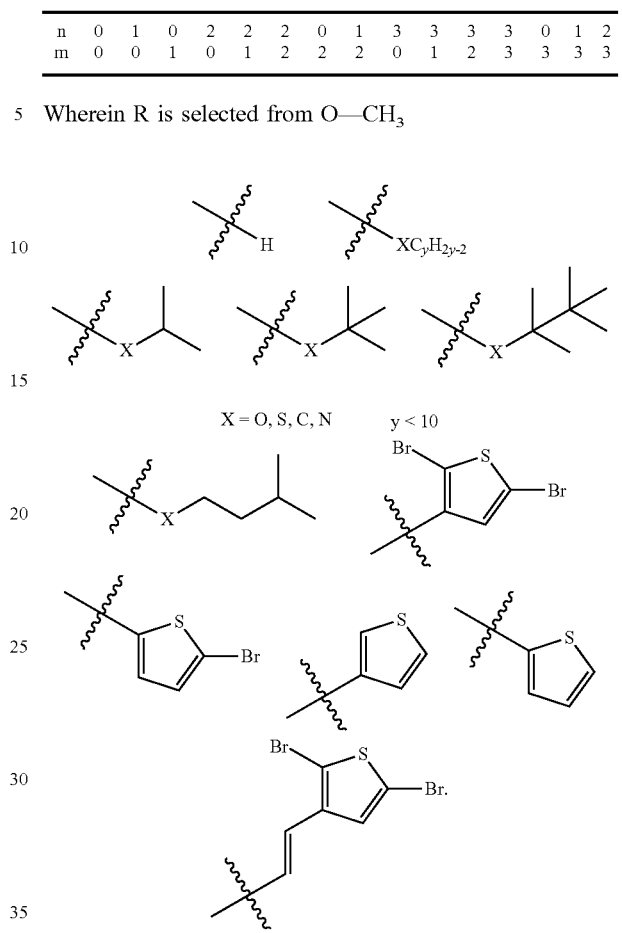
3. A process to synthesize a bichromic bipodal triphenylamine based dye wherein R is defined in claim 2, said process comprising:

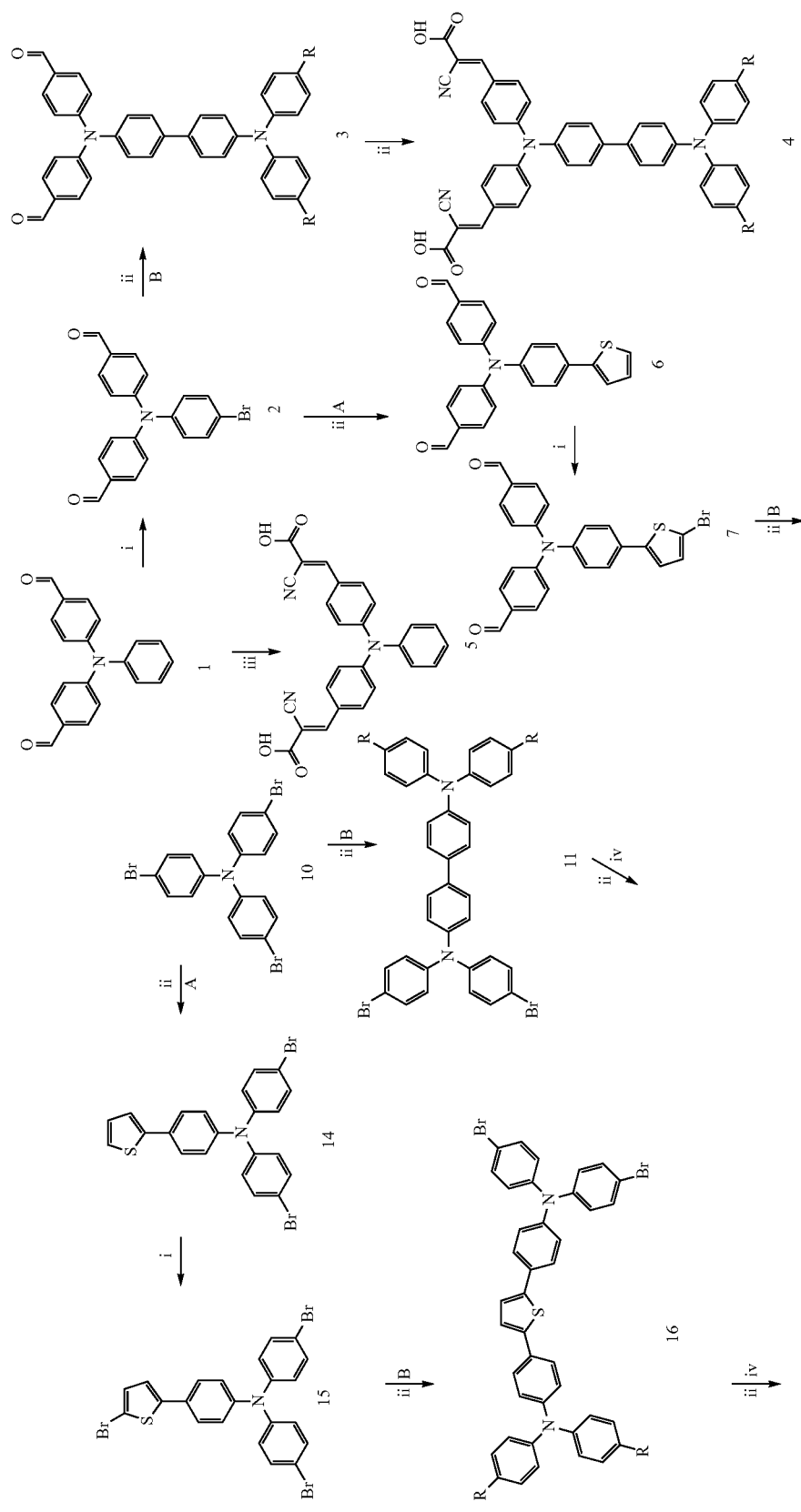

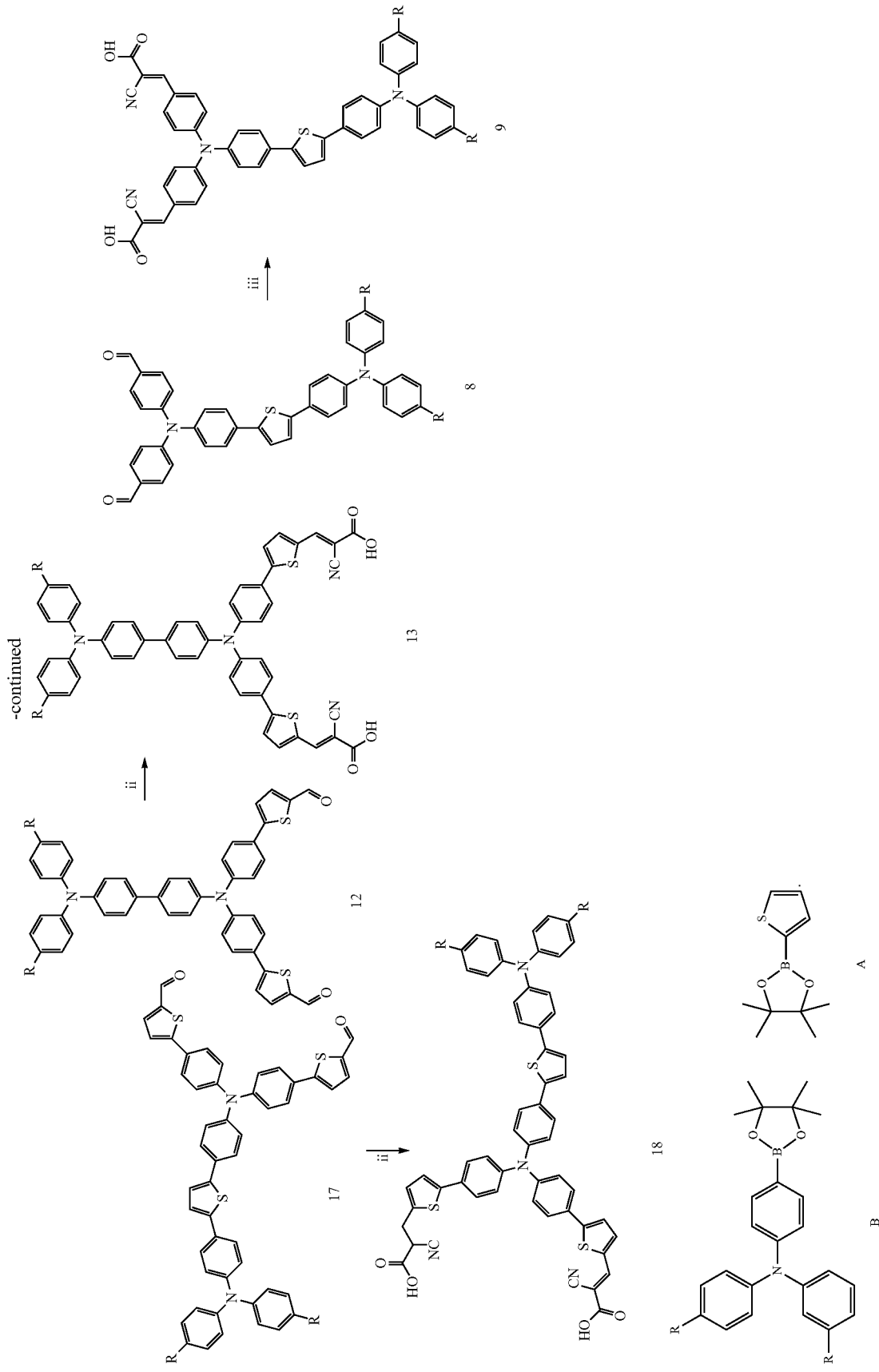

4. A process to synthesize bichromic bipodal triphenylamine based dye wherein R is defined in claim 2, said process comprising:
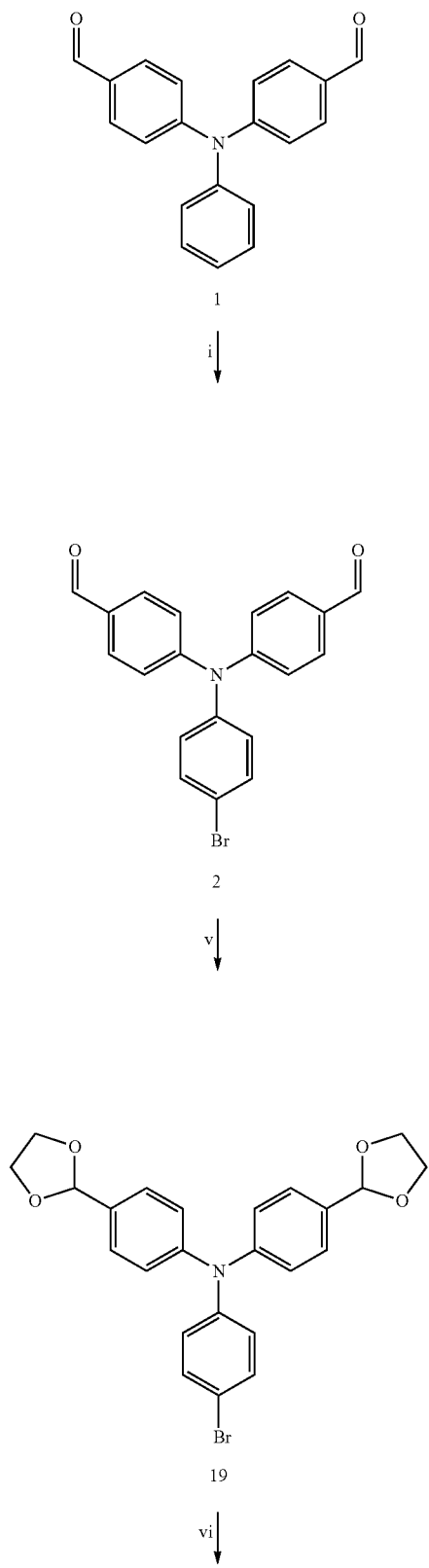
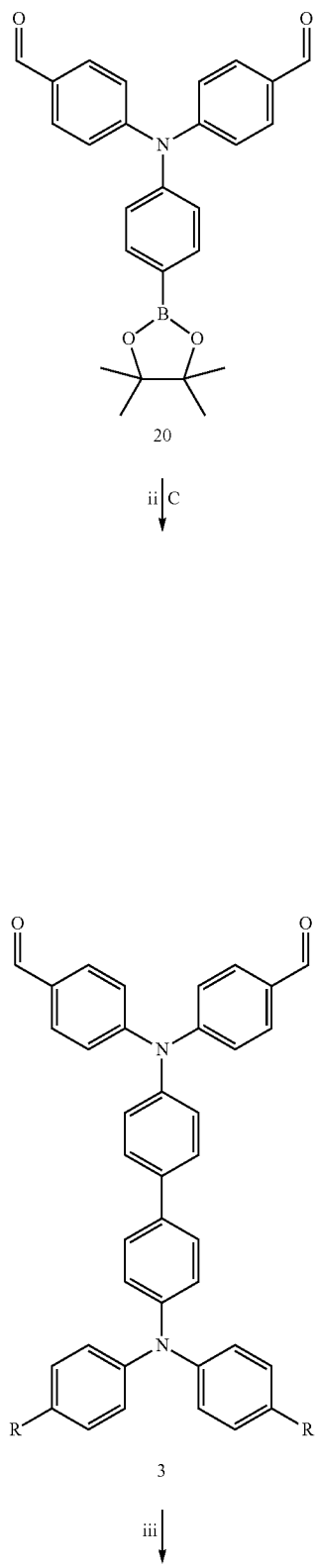

41
-continued
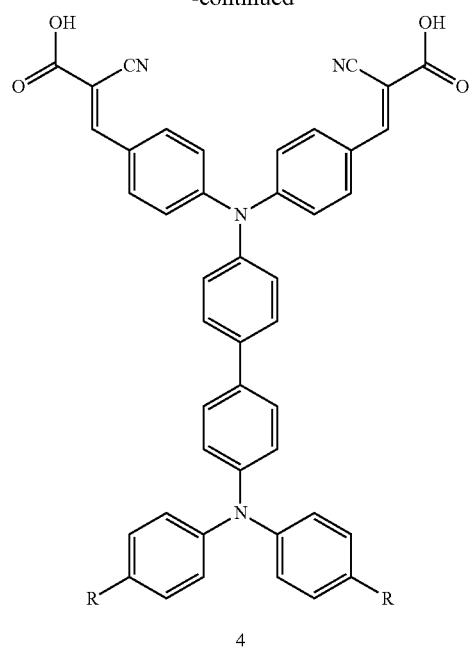
4
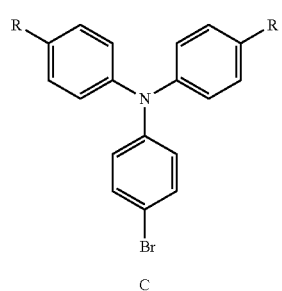
c
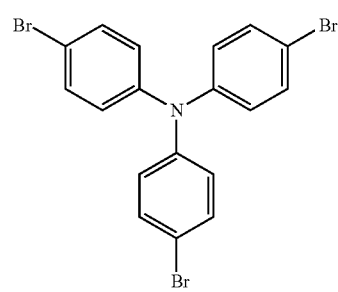
10
vi ↓
42
-continued
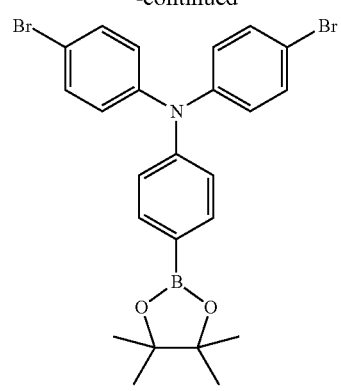
21
ii ↓ c
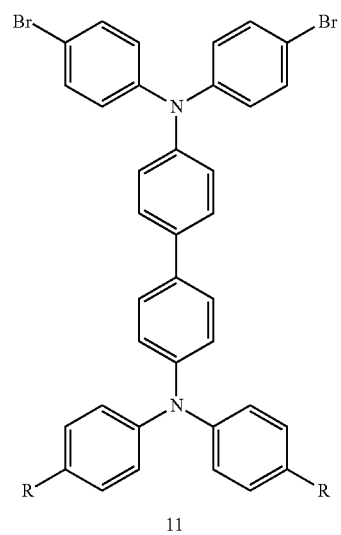
11
ii ↓ iv 43
-continued
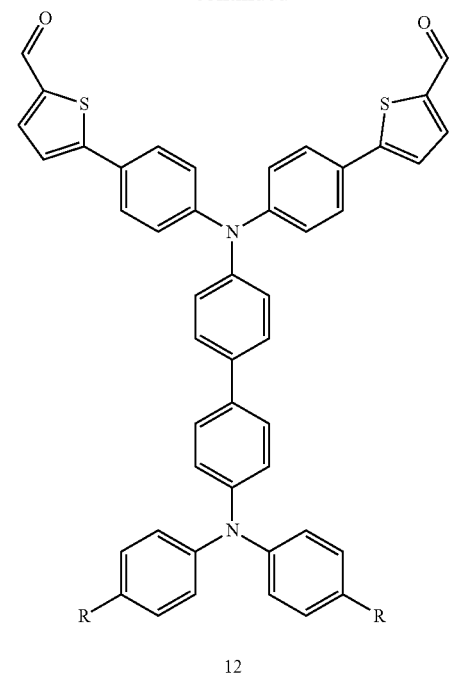
12
iii ↓
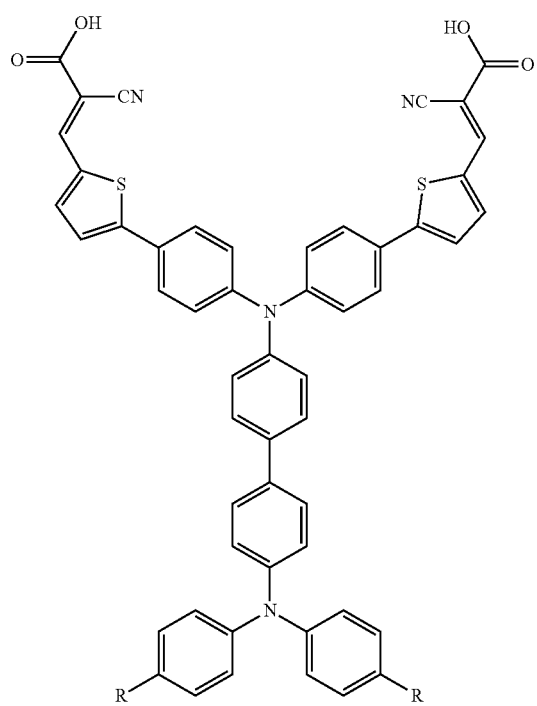
13
44
-continued
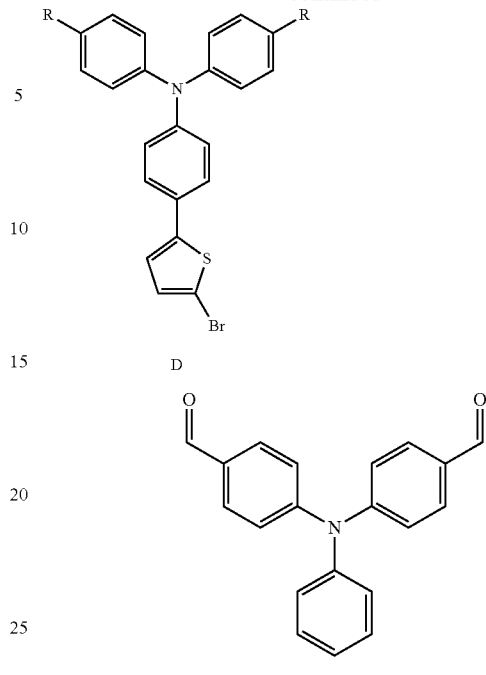
i ↓
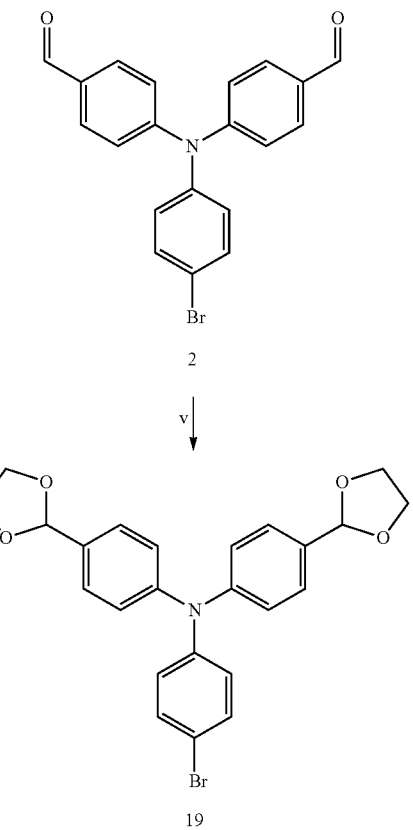
v ↓
vi ↓

45
-continued
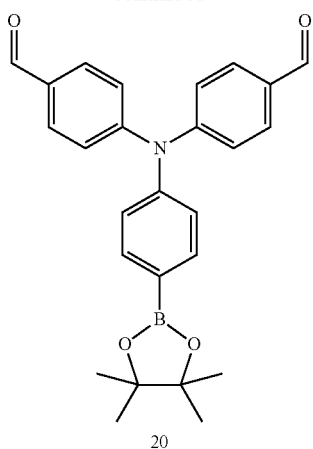
ii ↓ D
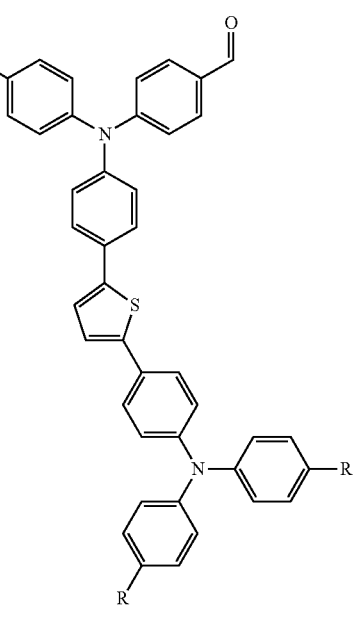
8
iii ↓
46
-continued
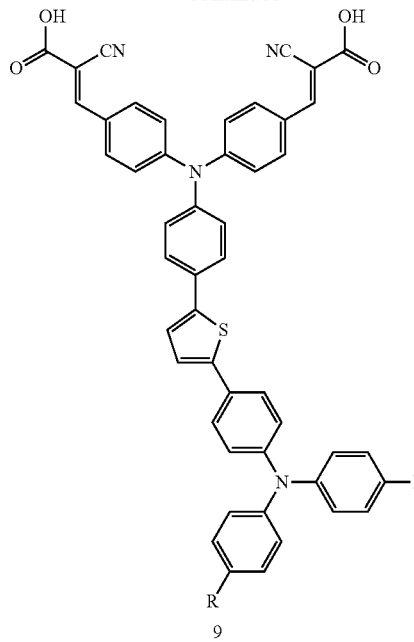
9
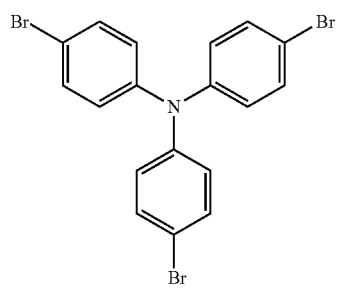
10
vi ↓
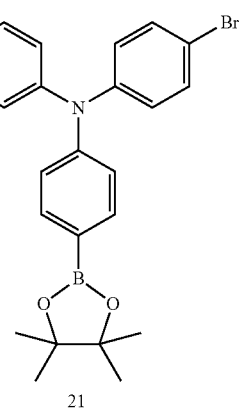
21
ii ↓ D

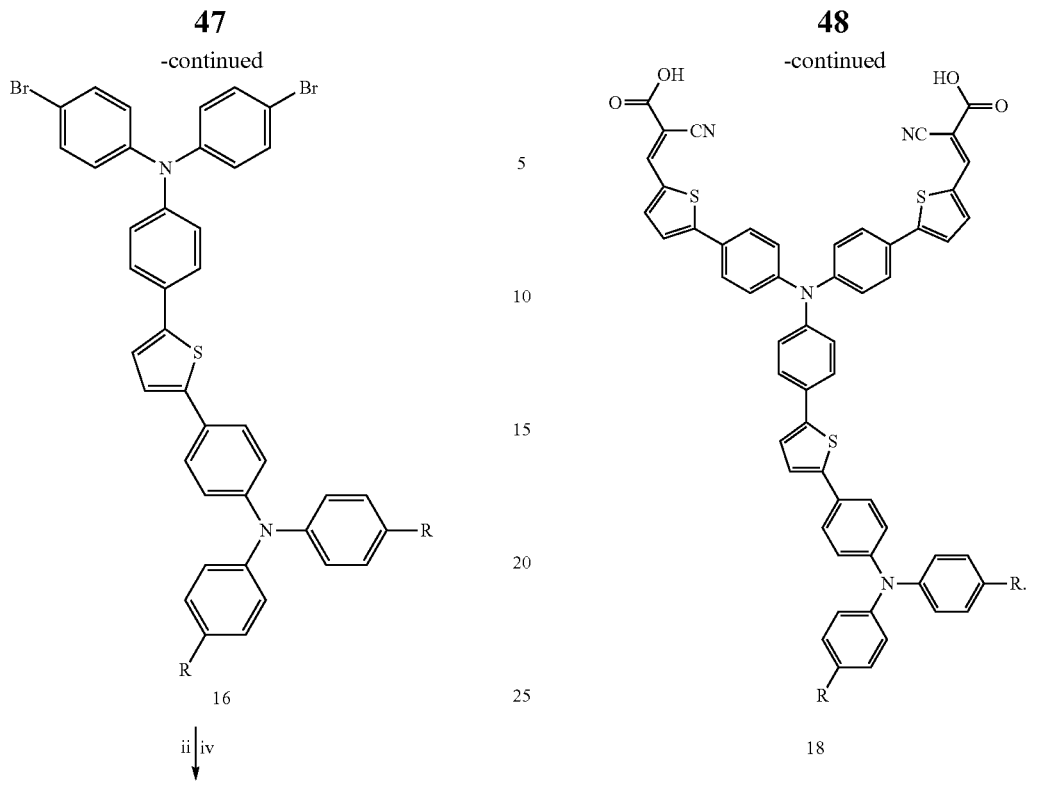

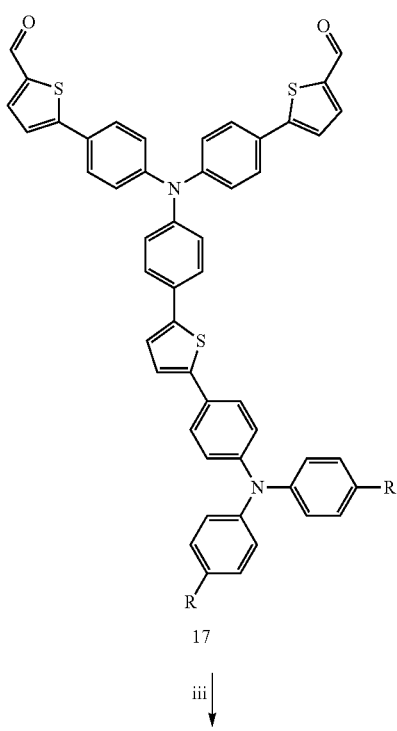

5. The process of claim 3 wherein I) is N-bromosuccinimide (1.10 eq), THF-EtOAc (1:1), 2 days; II) Pd(PPh$_3$)$_4$ (0.10 eq), NaOH (8 eq), THF:water (9:1), reflux 12 hours; III) cyanoacetic acid (4 eq), piperidine (0.25 eq), CHCb, reflux 8 hours; IV) acetic acid: water (2:1), reflux 12 hours; V) 1) n-BuLi (1.2 eq) dropwise, −78° C. dry THF 2) −78° C. 15 min 3) boronic ester (2 eq) one portion, −78° C. 4) MeOH quench; VI) Ethylene glycol (3 mL), p-TsOH (0.2 eq), toluene (50 mL), Dean-Stark, reflux overnight.

6. The process of claim 4 wherein I) is N-bromosuccinimide (1.10 eq), THF-EtOAc (1:1), 2 days; II) Pd(PPh$_3$)$_4$ (0.10 eq), NaOH (8 eq), THF:water (9:1), reflux 12 hours; III) cyanoacetic acid (4 eq), piperidine (0.25 eq), CHCb, reflux 8 hours; IV) acetic acid:water (2:1), reflux 12 hours; V) 1) n-BuLi (1.2 eq) dropwise, −78° C. dry THF 2) −78° C. 15 min 3) boronic ester (2 eq) one portion, −78° C. 4) MeOH quench; VI) Ethylene glycol (3 mL), p-TsOH (0.2 eq), toluene (50 mL), Dean-Stark, reflux overnight.

7. A dye-sensitized solar cell (DSSC) device comprising a dye of claim 1 wherein said dye is sensitized at diffuse light levels lower than about 100 mWcm$^{-2}$.

8. A dye-sensitized solar cell (DSSC) device comprising a dye of claim 2 wherein said dye is sensitized at diffuse light levels lower than about 100 mWcm$^{-2}$.

9. A dye-sensitized solar cell (DSSC) device comprising a dye of claim 1 wherein said dye is sensitized at diffuse light levels at about 25 mWcm$^{-2}$ to 5 mWcm$^{-2}$.

10. A dye-sensitized solar cell (DSSC) device comprising a dye of claim 2 wherein said dye is sensitized at diffuse light levels at about 25 mWcm$^{-2}$ to 5 mWcm$^{-2}$.

11. A dye-sensitized solar cell (DSSC) device comprising a dye of claim 1 wherein said dye is sensitized at diffuse light levels over than from about 10 mWcm$^{-2}$.

12. A dye-sensitized solar cell (DSSC) device comprising a dye of claim 2 wherein said dye is sensitized at diffuse light levels over than from about 10 mWcm$^{-2}$.

13. A Dye-sensitized solar cell (DSSC) device compromising at least one of the dyes of claim 1.

14. A Dye-sensitized solar cell (DSSC) device compromising the dyes of claim 2.

15. A dye-sensitized solar cell (DSSC) device comprising at least one of dye 4, 9, 13, 18 and combinations thereof.

16. The device of claim 14 wherein said dye is 4a.

17. The device of claim 14 wherein said dye is 9a.

18. The device of claim 14 wherein said dye is 13a.

19. The device of claim 14 wherein said dye is 18a.

20. The compound of claim 2 wherein said compound is

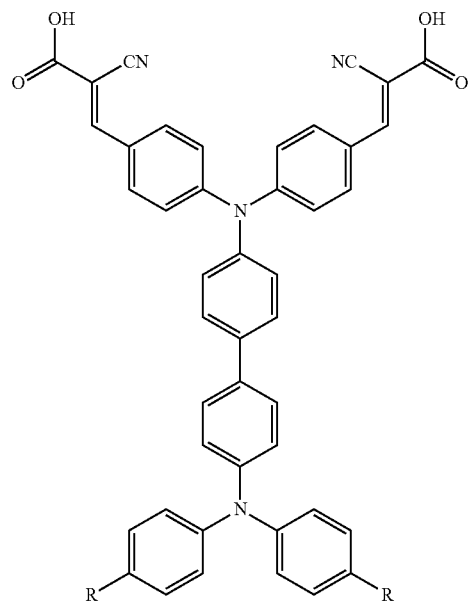

4 wherein R=OCH₃.

21. The compound of claim 2 wherein said compound is

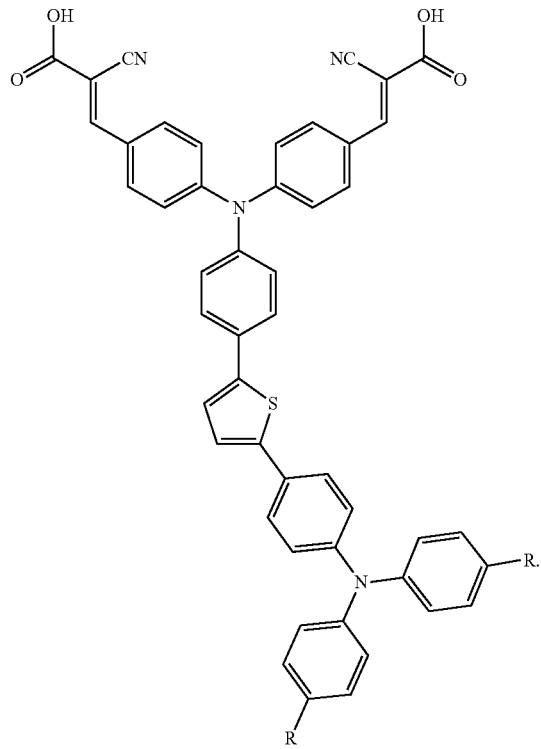

9

22. The compound of claim 2 wherein said compound is

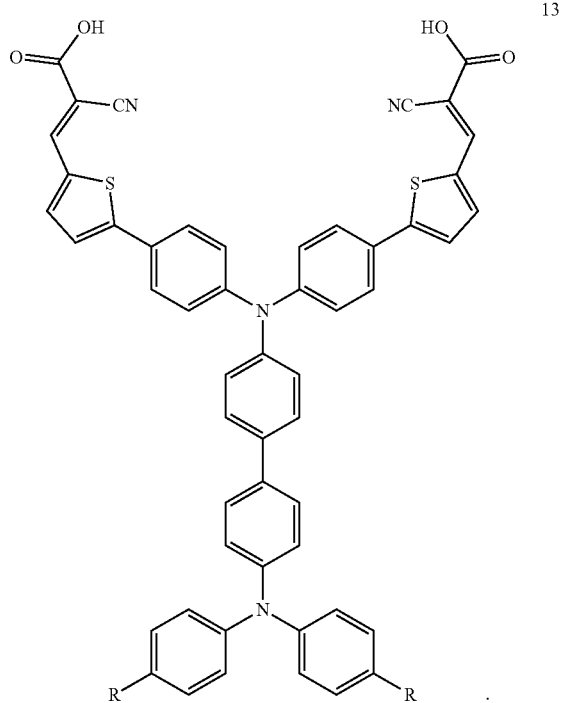

13

23. The compound of claim 2 wherein said compound is

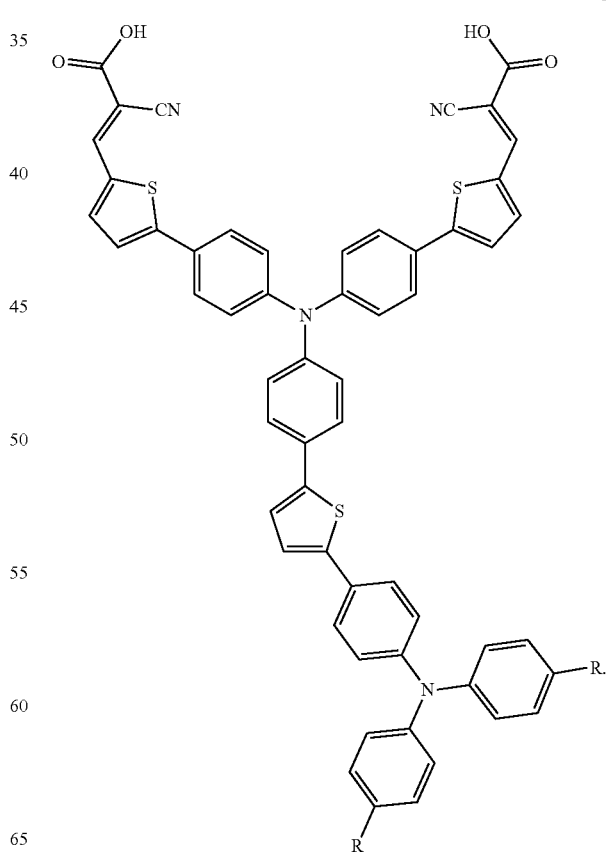

18

24. The DSSC device of claim 14, wherein said DSSC device functions at diffuse light levels lower than about 100 mWcm$^{-2}$.

25. The DSSC device of claim 14, wherein said DSSC device functions at diffuse light levels at about 25 mWcm$^{-2}$ to 5 mWcm$^{-2}$.

26. The DSSC device of claim 14, wherein said DSSC device functions at diffuse light levels over than from about 10 mWcm$^{-2}$.

* * * * *